United States Patent
Galindo Gonzalez

(10) Patent No.: US 12,485,448 B2
(45) Date of Patent: *Dec. 2, 2025

(54) DEVICE FOR MODIFYING A LINEAR SUBSTRATE

(71) Applicant: Southwire Company, LLC, Carrollton, GA (US)

(72) Inventor: Juan Alberto Galindo Gonzalez, Powder Springs, GA (US)

(73) Assignee: Southwire Company, LLC

( * ) Notice: Subject to any disclaimer, the term of this patent is extended or adjusted under 35 U.S.C. 154(b) by 172 days.

This patent is subject to a terminal disclaimer.

(21) Appl. No.: 17/840,227

(22) Filed: Jun. 14, 2022

(65) Prior Publication Data

US 2022/0305517 A1 Sep. 29, 2022

Related U.S. Application Data

(63) Continuation of application No. 17/574,256, filed on Jan. 12, 2022, now Pat. No. 12,097,527, which is a
(Continued)

(51) Int. Cl.
*B05C 3/15* (2006.01)
*B05D 1/18* (2006.01)
(Continued)

(52) U.S. Cl.
CPC ............... *B05C 3/15* (2013.01); *B05D 1/18* (2013.01); *B05D 7/20* (2013.01); *B21C 3/06* (2013.01); *B29C 48/154* (2019.02); *H01B 13/16* (2013.01); *H01B 13/323* (2013.01); *H01B 13/326* (2013.01); *H01B 13/327* (2013.01); *H01B 13/328* (2013.01); *B21C 3/14* (2013.01);
(Continued)

(58) Field of Classification Search
None
See application file for complete search history.

(56) References Cited

U.S. PATENT DOCUMENTS

| | | |
|---|---|---|
| 1,887,581 A | 11/1932 | Hinsky |
| 1,890,291 A | 12/1932 | Hinsky |

(Continued)

FOREIGN PATENT DOCUMENTS

| | | | | |
|---|---|---|---|---|
| CA | 2775024 A1 | * | 3/2011 | ............... B05C 3/12 |
| CN | 101139689 | | 3/2008 | |

(Continued)

OTHER PUBLICATIONS

Rosato, D., Wire and Cable, Extruding Plastics, pp. 469-493, 1998.
(Continued)

*Primary Examiner* — David P Turocy
(74) *Attorney, Agent, or Firm* — Merchant & Gould P.C.

(57) ABSTRACT

An apparatus and method for modifying an aspect of an exterior polymer material or polymer type material of a linear substrate with a fluid. The apparatus include a variable exposure gap within which the linear substrate is exposed to the fluid. The width of the exposure gap is varied with the speed of the linear substrate traversing the exposure gap to maintain a constant exposure time of the linear substrate with the modifying fluid.

20 Claims, 16 Drawing Sheets

Related U.S. Application Data continuation of application No. 16/182,030, filed on Nov. 6, 2018, now Pat. No. 11,298,719, which is a continuation of application No. PCT/US2017/031331, filed on May 8, 2017, which is a continuation of application No. 15/179,089, filed on Jun. 10, 2016, now Pat. No. 9,718,080.

(60) Provisional application No. 62/332,777, filed on May 6, 2016.

(51) Int. Cl.

| | | |
|---|---|---|
| *B05D 7/20* | (2006.01) | |
| *B21C 3/06* | (2006.01) | |
| *B29C 48/154* | (2019.01) | |
| *H01B 13/16* | (2006.01) | |
| *H01B 13/32* | (2006.01) | |
| *B21C 3/14* | (2006.01) | |
| *B21C 9/00* | (2006.01) | |
| *B29C 48/06* | (2019.01) | |
| *B29C 48/25* | (2019.01) | |
| *B29C 48/30* | (2019.01) | |
| *B29C 48/325* | (2019.01) | |
| *B29C 48/34* | (2019.01) | |
| *B29C 70/50* | (2006.01) | |

(52) U.S. Cl.
CPC ............ *B21C 9/00* (2013.01); *B29C 48/06* (2019.02); *B29C 48/266* (2019.02); *B29C 48/302* (2019.02); *B29C 48/325* (2019.02); *B29C 48/34* (2019.02); *B29C 70/50* (2013.01); *Y10S 118/11* (2013.01); *Y10S 118/18* (2013.01); *Y10S 118/19* (2013.01)

(56) References Cited

U.S. PATENT DOCUMENTS

| | | | |
|---|---|---|---|
| 1,944,823 A | 1/1934 | Lamont | |
| 2,428,965 A | 10/1947 | Frisco et al. | |
| 2,543,316 A | 2/1951 | Feild, Jr. et al. | |
| 2,766,136 A | 10/1956 | Gray | |
| 2,986,116 A | 5/1961 | Zerwes | |
| 3,226,178 A | 12/1965 | Walker | |
| 3,544,388 A * | 12/1970 | Russell | C23C 22/77 148/253 |
| 3,722,899 A * | 3/1973 | Sedwell | F16J 15/168 49/93 |
| 3,801,359 A | 4/1974 | Polizzano et al. | |
| 3,814,579 A | 6/1974 | Birke et al. | |
| 3,879,973 A | 4/1975 | Godyn | |
| 4,327,130 A * | 4/1982 | Pipkin | B05C 3/18 427/209 |
| 4,505,222 A | 3/1985 | Holt et al. | |
| 4,532,158 A | 7/1985 | Taylor et al. | |
| 4,697,291 A | 10/1987 | Shepherd et al. | |
| 4,708,887 A | 11/1987 | Baxter et al. | |
| 5,230,709 A | 7/1993 | Holfeld et al. | |
| 5,897,708 A | 4/1999 | Hsu | |
| 6,430,980 B1 | 8/2002 | Weinhold | |
| 6,652,654 B1 | 11/2003 | Propp | |
| 6,733,543 B2 | 5/2004 | Pyles et al. | |
| 7,175,675 B2 | 2/2007 | Pyles et al. | |
| 7,442,877 B2 | 10/2008 | Kamata et al. | |
| 7,611,547 B2 | 11/2009 | Bracken et al. | |
| 7,875,309 B2 | 1/2011 | Kamata et al. | |
| 7,921,680 B2 | 4/2011 | Kaczkowski et al. | |
| 7,968,142 B2 | 6/2011 | Kamata et al. | |
| 8,286,578 B2 | 10/2012 | Leenders | |
| 8,586,135 B2 | 11/2013 | Taniguchi et al. | |
| 8,624,118 B2 | 1/2014 | Kauffman | |
| 8,968,422 B2 | 3/2015 | Tutmark | |
| 9,064,618 B2 | 6/2015 | Kuchta et al. | |
| 9,718,080 B1 | 8/2017 | Gonzalez et al. | |
| 2003/0124253 A1 | 7/2003 | Kamata et al. | |
| 2006/0038356 A1 | 2/2006 | Lehtinen | |
| 2006/0230553 A1 | 10/2006 | Thullen et al. | |
| 2014/0250609 A1 | 9/2014 | Tutmark et al. | |
| 2016/0074897 A1 | 3/2016 | Veglia et al. | |
| 2016/0086692 A1 | 3/2016 | Crawford et al. | |

FOREIGN PATENT DOCUMENTS

| | | | |
|---|---|---|---|
| CN | 202594973 | | 12/2012 |
| CN | 202594975 | | 12/2012 |
| CN | 103508682 | | 1/2014 |
| CN | 103508684 | | 1/2014 |
| CN | 103508685 | | 1/2014 |
| CN | 102856007 B | | 9/2017 |
| DE | 3854608 | | 8/1989 |
| DE | 4308889 | | 6/1994 |
| DE | 10258234 | | 7/2004 |
| GB | 1327699 | | 8/1973 |
| GB | 1427446 | | 3/1976 |
| JP | 11011802 | | 1/1999 |
| JP | 2005503487 A | * | 2/2005 |
| JP | 2009026475 A | | 2/2009 |

OTHER PUBLICATIONS

A Continuous Dyeing Carpet Directory and Guide, FloorBiz, Inc. brochure, 2010.

Mural—Dropbox Corporate Offices, San Francisco, CA (undated).

* cited by examiner

Compounded

Infused

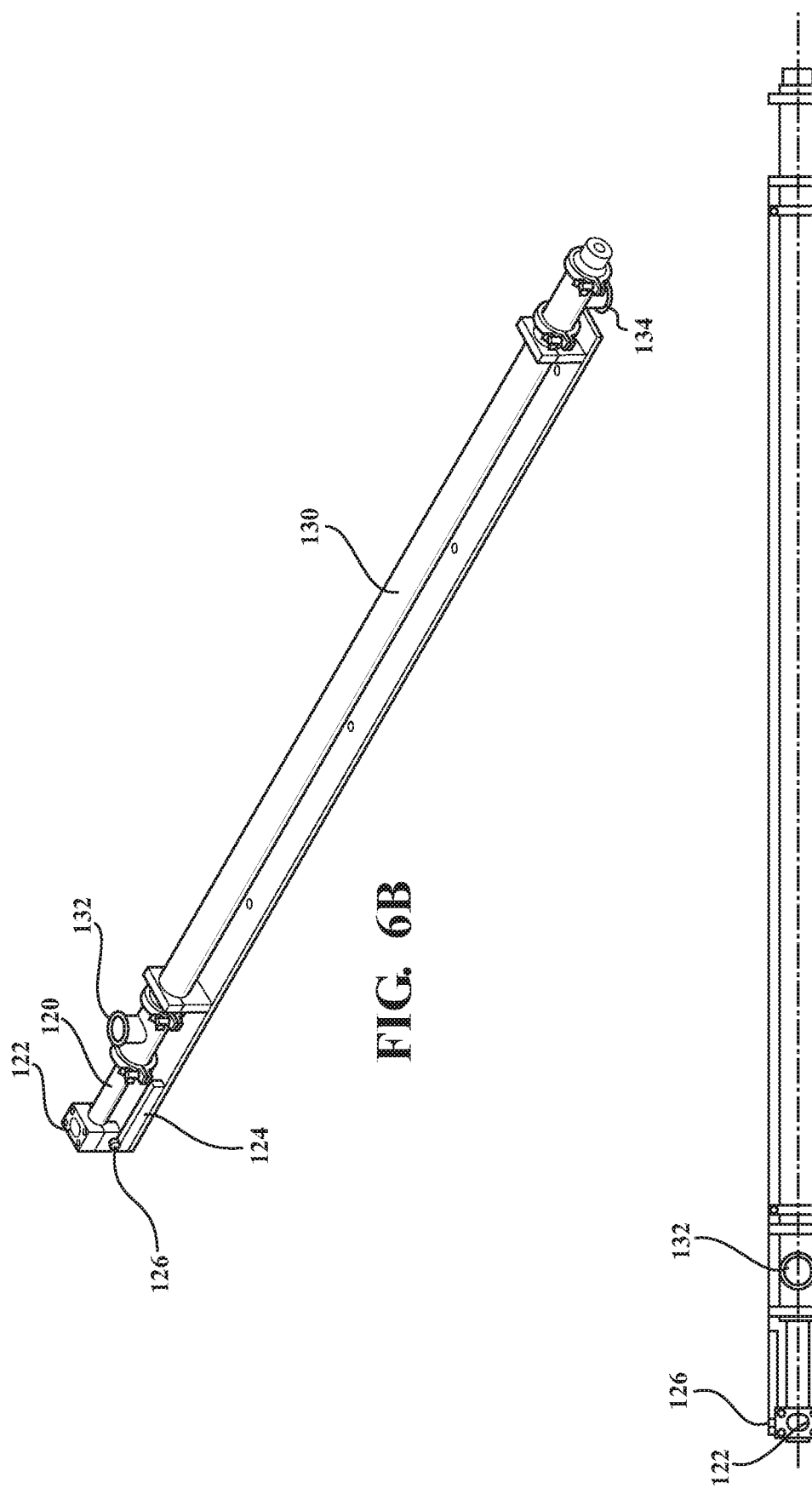

DEVICE FOR MODIFYING A LINEAR SUBSTRATE

CROSS REFERENCE TO RELATED APPLICATIONS

This application is a continuation of U.S. patent application Ser. No. 17/574,256, filed Jan. 12, 2022, which is a continuation of U.S. patent application Ser. No. 16/182,030, filed Nov. 6, 2018, now U.S. Pat. No. 11,298,719, which is a continuation of International Patent Application No. PCT/US2017/031331, filed May 8, 2017, which is a continuation of U.S. patent application Ser. No. 15/179,089, filed Jun. 10, 201, now U.S. Pat. No. 9,718,080, which claims the benefit of U.S. Provisional Patent Application No. 62/332,777 filed May 6, 2016, the entire contents of each of which are incorporated herein by reference.

BACKGROUND

1. Field of the Invention

The present specification generally relates to systems for adding one or more actives to a preformed polymer in the form of a linear substrate. In more specific aspects, linear substrates may be hose or electrical or other wire and cable jackets or insulation.

2. Related Technology

Linear polymeric substrates commonly have coloration to distinguish and differentiate between neighboring substrates when placed into service or simply for aesthetic purposes. For example, motorcycle or bicycle brake lines may be provided in a variety to colors to provide a sharp appearance. Color has previously been added to linear polymeric substrates by compounding a color into the plastic mixture to distribute the color throughout the polymeric material. However, compounding color into the polymer requires color determination to be made at the time of manufacture and has an associated cost with maintaining a large selection of colored material in stock to match the gauge and color requests from customers.

Moreover, achieving consistent color control between runs of substrate coloration has proven difficult. Two red lines from the same manufacturer, for example, may exhibit visually distinct colors because of difficulty in achieving a consistent coloring between runs or at multiple manufacturing/shipping facilities. Additionally, switching from one color to another color has required extensive time, manual labor, and equipment cleaning. Prior systems have separate lines for each color that each need to be monitors or the infusion systems have had to be cleaned between each color.

As such, a need exists for the ability to quickly add customer requested coloring and/or other physical or chemical characteristics to generic, white, or neutral-colored linear substrates at the time of customer request and to do so in a rapid and cost effective manner. This need extends to the ability to readily establish consistent coloring between runs and coloring locations and to delay product customization to improve customer service.

SUMMARY

The following summary is provided to facilitate an understanding of some of the innovative features unique to the present disclosure and is not intended to be a full description. A full appreciation of the various aspects of the disclosure can be gained by taking the entire specification, claims, drawings, and abstract as a whole.

It is a first object to provide an apparatus for the import of physical or chemical characteristics such as color, weathering, lubricity, or other characteristic to provide on demand and rapidly tailorable production of linear substrates. This object is achieved by the provided linear substrate infusion compartment for infusing one or more components of an infusion fluid into a linear substrate, the linear substrate infusion compartment including: a processing barrel having an infusion chamber defined therein, the processing barrel also having a linear substrate inlet into the infusion chamber and a linear substrate outlet out of the infusion chamber, the processing barrel further including an infusion fluid inlet and an infusion fluid outlet, the infusion fluid inlet and the infusion fluid outlet being in fluid communication with the infusion chamber, the infusion chamber being dimensionally reconfigurable between different configurations. In some aspects, the different configurations of the linear substrate infusion compartment are different configurations of length of an exposure gap defined within the infusion chamber. The exposure gap optionally is reconfigurable from a length of zero to greater than zero. Optionally, the processing barrel is configured to expose the linear substrate to the infusion fluid in the exposure gap when the exposure gap has a length of greater than zero and to not expose the linear substrate to the infusion fluid when the exposure gap has a length of zero. The exposure gap may be defined between the linear substrate inlet and the linear substrate outlet. In some aspects, the different configurations are different configurations in volume of the infusion chamber. Optionally, the infusion chamber is configured to be dimensionally reconfigurable between the different configurations while the infusion fluid is contacting the linear substrate. In other words, the linear substrate inlet and the linear substrate outlet may be configurable to be moveable between a plurality of relative positions while the infusion fluid is contacting the linear substrate.

The linear substrate infusion compartment optionally includes portions of the processing barrel that are moveable relative to one another to define the different configurations, the infusion chamber being in a first configuration of the different configurations when the portions of the processing barrel are in a first relative position and the infusion chamber being in a second configuration of the different configurations when the portions of the processing barrel are in a second relative position. Optionally, the processing barrel includes an inner processing vessel and an outer processing vessel, the inner processing vessel and the outer processing vessel forming a nested arrangement along a longitudinal length of the processing barrel, the inner processing vessel being axially moveable relative the outer processing vessel.

In some aspects, as part of a compartment, relative to one another, the infusion fluid inlet is positioned toward one end of the processing barrel and the infusion fluid outlet is positioned toward an opposing end of the processing barrel. Optionally, relative to one another, the infusion fluid inlet is positioned toward the linear substrate outlet of the processing barrel and the infusion fluid outlet is positioned toward the linear substrate inlet of the processing barrel. In various aspects, both the infusion fluid inlet and the infusion fluid outlet traverse a wall of the outer processing vessel.

In some aspects, a linear substrate infusion compartment includes infeed seal at the linear substrate inlet, the infeed seal configured to allow a linear substrate to pass into the processing barrel while substantially retaining the infusion fluid within the processing barrel. Optionally, a compartment includes a discharge seal configured to allow portions of the inner processing vessel to pass into and out of the outer processing vessel. Optionally, a linear substrate infusion compartment includes an inner seal, the inner seal positioned in the inner processing vessel and configured to allow a linear substrate to pass through the inner processing vessel and substantially retain an infusion fluid within the processing barrel. In some aspects, a linear substrate infusion compartment includes an infeed seal positioned at the linear substrate inlet and configured to allow the linear substrate to pass into the processing barrel while substantially retaining the an infusion fluid in the processing barrel, a discharge seal configured to allow portions of the inner processing vessel to pass into and out of the processing barrel while substantially retaining the infusion fluid within the processing barrel, and an inner seal positioned in the inner processing vessel and configured to allow the linear substrate to pass through the inner seal while substantially retaining the infusion fluid within the processing barrel.

In some aspects, a substrate infusion compartment is incorporated into a system further comprising a first fluid loop fluidically connected to the infusion compartment at the infusion fluid inlet and the infusion fluid outlet. The first fluid loop optionally includes a first pump configured for directionally moving the infusion fluid through the first fluid loop. Optionally, a first additive source is coupled to the first fluid loop and configured to provide a first additive to the first fluid loop, wherein the first additive is the component or forms a part of the component of the infusion fluid. In some aspects, a plurality of additive sources are coupled to the first fluid loop, each of the plurality of additive sources being configured to respectively provide one or more additives to the first fluid loop. Optionally, a heater is provided, the heater configured to control the temperature of the infusion fluid within the first fluid loop to an infusion temperature. The different additives are optionally each a component or form a part of the component of the infusion fluid. In some aspects, an additive is a dye. In some aspects, an additive is a weatherability enhancer that provides enhanced weatherability to the linear substrate.

In some aspects, a linear substrate infusion compartment is incorporated into a system further including a substrate marking system positioned downstream from the linear substrate outlet. The marking system optionally includes a laser.

In any aspect, a linear substrate infusion compartment, or system incorporating a linear substrate infusion compartment optionally excludes an airwipe.

It is a further object to provide processes for infusing one or more components of an infusion fluid into the surface, optionally, the outer surface, of a linear substrate to impart differing or enhanced physical or chemical characteristics to the linear substrate. A process includes passing a linear substrate through an infusion compartment in a first direction, the infusion compartment comprising a processing barrel with a linear substrate inlet and a linear substrate outlet, an infusion chamber defined within the processing barrel and being dimensionally reconfigurable between different configurations; and contacting the linear substrate with the infusion fluid within the infusion chamber of the processing barrel while the infusion chamber is in a first configuration of the different configurations, the step of contacting being conducted for an infusion time with the infusion fluid at an infusion temperature, the infusion time and the infusion temperature being sufficient to infuse the one or more components of the infusion fluid into at least an outer surface of the polymeric linear substrate. Optionally, the step of contacting further includes contacting the linear substrate with the infusion fluid within the infusion chamber while the infusion chamber is in a second configuration that is different from the first configuration. Optionally, the step of contacting further includes dimensionally reconfiguring the infusion chamber between the first and second configurations while the linear substrate is passing through the infusion chamber. In some aspects of a process, the infusion time is less than one minute. Optionally, the linear substrate is at ambient temperature (optionally not heated or cooled) prior or immediately prior to the step of passing. In some aspects, the step of contacting is by flowing the infusion fluid along a length of the linear substrate in a second direction, the second direction substantially opposite the first direction.

In some aspects a process further includes flushing the processing barrel with a flushing fluid, and contacting the linear substrate with a second infusion fluid having a second component, the second component differing structurally from the first component. Optionally, the flushing fluid is the second infusion fluid.

In any aspect, a process optionally excludes a solvent removal step, optionally excludes a solvent removal step using air, optionally forced air.

A process is optionally performed using an linear substrate infusion compartment wherein the different configurations are different configurations of length of an exposure gap defined within the infusion chamber. Optionally, the contacting step includes changing the length of the exposure gap from zero to greater than zero. In some aspects, the contacting step includes passing the linear substrate through the exposure gap and exposing the linear substrate to the infusion fluid in the exposure gap. The contacting step optionally includes increasing or decreasing the speed of the linear substrate during passing through the infusion chamber. Optionally during the contacting step the speed of the linear substrate is increased or decreased and optionally the length of an exposure gap defined within the infusion chamber and traversed by the linear substrate is respectively increased or decreased.

In a process for infusion of one or more additives into the surface, optionally, the outer surface, of a linear substrate, the linear substrate is or includes one of a wire, cable or hose. Optionally, the linear substrate is white, gray or neutral in color prior to the passing step and is a color other than white gray or neutral after the contacting step.

A process optionally includes a step of marking the substrate after the contacting step, the marking optionally imparting an identifying indicia. The marking is optionally laser marking of the substrate. Optionally, the marking step includes sequentially marking the substrate with the identifying indicia beginning at zero or substantially zero.

Optionally, the contacting step and the reconfiguring step result in a change in one or more physical or chemical characteristics of the linear substrate. The characteristic is optionally a change in color. The characteristic is optionally a change in weatherability.

BRIEF DESCRIPTION OF THE DRAWINGS

The aspects set forth in the drawings are illustrative and exemplary in nature and not intended to limit the subject matter defined by the description and claims. The following detailed description of the illustrative aspects can be understood when read in conjunction with the following drawings, where like structure is indicated with like reference numerals and in which:

FIG. 6B illustrates a processing barrel, according to one or more aspects described herein;

FIG. 6C illustrates a processing barrel, according to one or more aspects described herein;

DETAILED DESCRIPTION

Figure 1A:
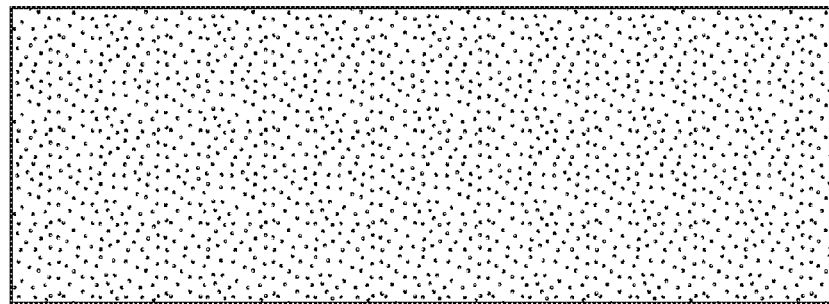
FIG. 1A illustrates a schematic of compounded polymer.

As described herein, various aspects of linear substrate infusion compartments are disclosed with features or structures that promote color infusion into the substrate or a coating on the substrate. The systems provided are useful for infusion of one or more active agents the function to impart a physical or chemical characteristic to the polymeric linear substrate, optionally used in forming the jacket or insulation of electrical wire/cable, in the production of hose, or for other linear substrates.

In the following description of the various examples and components of this disclosure, reference is made to the accompanying drawings, which form a part hereof, and in which are shown by way of illustration various example structures and environments in which aspects of the disclosure may be practiced. It is to be understood that other structures and environments may be utilized and that structural and functional modifications may be made from the specifically described structures and methods without departing from the scope of the present disclosure.

The description is primarily directed to the infusion of colored dye(s) into a polymer material of a general linear substrate, and for example, electrical cable. Such is presented for illustrative and descriptive purposes alone. The disclosure is equally applicable to other linear substrates such as but not limited to electrical wire or cable jackets, insulation, coverings, hose or other hollow tubing, optical cable, solid linear substrates, sheeting or films of an elongated nature, among other items recognized in the art. In addition, the disclosure is equally applicable to infusion of additive molecules other than dyes imparting other properties to the polymer material. Illustratively, other additive molecules suitable for infusion include but are not limited to anti-weathering agents (illustratively, a light stabilizer), anti-static, flame retardant, lubricant, antioxidant, or other additive. As such, unless otherwise indicated, infusion of a dye is equally appreciated to describe infusion of one or more other type of additive molecule.

Provided are apparatuses and processes for infusing an additive into a linear substrate that include immersing or otherwise contacting a linear substrate with an infusion fluid that includes as a component an additive to be infused into the surface of the linear substrate. An infusion fluid may be predominantly aqueous, predominantly non-aqueous, or other. An infusion fluid may also include one or more solubilizers to promote solubilization of one or more additive molecules. In one specific aspect, the additive may be a colorant, illustratively a dye. In one example, the linear substrate is optionally an electrical cable and can be a cable with insulation and jacket of a neutral color (e.g. white, off-white, or gray). The cable may also have one or more polymer coatings formed from one or more polymers.

The processes provided in this disclosure can be utilized in the addition of additives such as colorant to previously manufactured cable or to cable during the manufacturing process in an in-line process, but after extrusion such that color is imparted to the substrate downstream from the extrusion line.

The processes and systems provided herein are optionally employed on any type of polymeric material that is used to form a linear substrate. Illustrative examples of polymers include thermoplastics and thermoset plastics. Exemplary polymer and polymer type materials that may be imparted as provided herein include one or more of polypropylene (PP), polyethylene terephthalate (PET), polybutylene terephthalate (PBT), polycarbonates (PC), polyethylene (PE), low density polyethylene (LDPE), high density polyethylene (HDPE), ultrahigh molecular weight polyethylene (UHMWPE), cross-linked polyethylene (XLPE), cross-linked polyolefin (XLPO), ethylene vinyl acetate (EVA), ethyl methacrylate (EMA), ethylene ethyl acrylate (EEA), ethylene butyl acrylate (EBA), polystyrene (PS), impact modified polystyrene (HIPS), styrene/acrylonitrile (SAN), styrene/acrylic (S/A), styrene/maleic anhydride (SMA), poly vinyl chloride (PVC), chlorinated poly vinyl chloride (CPVC), styrene ethylene butylene styrene (SEBS), styrene butadiene styrene (SBS), thermoplastic olefin (TPO), polyolefin elastomer (POE), olefin block copolymer (OBC), polymethylmethacrylate (PMMA), PVC/acrylic blend (PVC/MA), polyester (PETG), polyacrylate (PAR), liquid crystal polyester (LCP), nylon type 6 (N6), nylon type 6,6 (N6,6), nylon type 11 (N11), nylon type 12 (N12), polyphthalamide (PPA), polyamideimide (PAI), polyetherimide (PEI), polyimide (PI), polyacetyl, polyphenylene oxide blend (PPO), polyaryletherketone (PAEK), polyetheretherketone (PEEK), polyphenylene sulfide (PPS), polysulfone (PSF), polyethersulfone (PES), polyarylsulfone (PAS), polyurethane (TPU), acrylonitrile copolymer (ANC), polylactic acid (PLA), nylon, PET copolymers, acrylics, ethlylene (meth)acrylic acid (commercially available under the trade name Surlyn™ from DuPont), polyethylene naphthalate (PEN), polybutylene terephthalate (PBT), polyoxymethylene (POM), polyvinylidene fluoride (PVdF), polyamides illustratively high performance polyamides (PPA), polycarbonate co-polymers, polyimides, elastomeric polymers illustratively thermoplastic elastomers (TPE), urethanes, polyurethanes, acrylic such as poly(methyl methacrylate) (PMMA), polyarylsulfone, acrylonitrile butadiene styrene (ABS), polyphenylene sulfides (PPS), polyether ether ketones (PEEK), liquid crystal polymer (LCP), or other polymers. In particular aspects, the polymer to be modified is or includes PET, PC, and nylon, among others.

Processes of infusing a polymer, optionally a polymer used on electrical wire or cable include forming an infused polymer material optionally by: providing a polymer material in solid form; mixing, immersing, or coating the polymer material with an infusion fluid at an infusion temperature optionally below the melting temperature of the polymer for an infusion time, the infusion fluid comprising one or more additive materials and one or more infusion agents, the one or more additive materials imparting one or more improved physical or chemical characteristics to the polymer illustratively color change, weatherability, antistatic, lubricity, or other characteristic to the polymer relative to a polymer material that is not infused with the one or more additive materials, the one or more infusion agents operable to promote penetration of the additive material into the surface of the polymer material; and infusing the additive material into the polymer material by said mixing, immersing, or coating step thereby forming an infused polymer material.

Figure 1B:
FIG. 1B illustrates a schematic of an infused polymer, according to one or more aspects described herein.

With reference to FIGS. 1A and 1B, infused polymer material provides a more intense or dense additive concentration while utilizing less additive material overall. Specifically, FIG. 1A illustrates a polymer where the additive, such as dye, is compounded as part of the polymer formulation according to prior methods. When compounding the additive as part of the polymer formulation the concentration of the additive is consistent throughout the material. Conversely, infusion, as illustrated in FIG. 2B, focuses the additive near the surface of the polymer material. Limiting the additive near the surface of the polymer material allows a higher concentration of additive while using a fraction of the total additive. This allows for more intense coloration of polymers while using less total dye. In some aspects, an infusion technique may provide 10 times the concentration of the additive while utilizing only ⅓ of the total additive when coloring a ⅛$^{th}$ inch thick piece compared to traditional compounding techniques.

A process includes infusing an additive into a linear substrate or portion thereof at an infusion temperature. An infusion temperature is optionally below the glass transition temperature (Tg) of the polymer of the polymeric linear substrate, optionally below the melting temperature of the polymer. In some aspects, the infusion temperature is above the Tg. Optionally, the infusion temperature is at or above the Tg and below the melting temperature. In some aspects, an infusion temperature is from 60 degrees Celsius to 98 degrees Celsius, optionally 81 degrees Celsius to 91 degrees Celsius.

A polymer linear substrate is infused for an infusion time. An infusion time is optionally 1 minute or less, optionally at or between 0.01 second to 1 minute. During the infusion time, the additive material following infusion optionally penetrates the polymer linear substrate to a depth of less than 2 millimeters, optionally to less than 1 millimeter. In some aspects, an additive material is infused to a final depth of less than 200 microns.

In some aspects, the polymer linear substrate is preheated to the infusion temperature prior to contact with an infusion fluid and/or dye material. Optionally, the infusion fluid and/or additive material is heated to the infusion temperature. Optionally, an unheated (cooled or substantially room temperature) polymer linear substrate is immersed, mixed, or otherwise contacted with a heated infusion fluid. Optionally, a polymer linear substrate is not heated above ambient (e.g. room) temperature, optionally not heated above 25° C. Optionally, a polymer linear substrate is cooled to a temperature of 25° C. or less prior contacting an infusion fluid.

In some aspects, a polymer material forming a polymer linear substrate is contacted with an infusion fluid including one or more infusion agents and one or more additive materials. An infusion agent is a chemical composition operable to promote penetration of an additive material into the surface of a polymer. An infusion fluid is optionally an aqueous solution, or a solution of one or more organic solvents or solutes. An infusion fluid is optionally entirely formed of an infusion agent and an additive. In some aspects, an infusion fluid includes water, an infusion agent, and optionally one or more solubilization promoters. A solubilization promoter is illustratively one more surfactants or emulsifiers. An infusion fluid includes one or more additives for imparting physical or chemical characteristics to the polymer. Accordingly, in some aspects, the infusion fluid may be a liquid.

In some aspects, an additive material to be infused into a polymer is a dye. A dye used to form a colored polymer according to particular aspects is a stable dye or an unstable dye. In some aspects, a dye is an unstable dye, optionally an unstable acid dye. An "unstable dye" as defined herein is a dye that is chemically or structurally alterable by exposure to heat, light energy, or both. Several such dyes are known in the art. An unstable dye optionally includes azo type dyes or unstabilized quinone dyes. Illustrative examples of acid unstable dyes include Acid Blue #60, Acid Red #151, Acid Black #2, Acid Yellow #23, and Acid Violet #17. Optionally, a dye is a static dye. As used herein, the term "static dye" means a dye that does not substantially change color upon exposure to (or being shielded from) ultraviolet (UV) light.

Static dyes are optionally fabric dyes and disperse dyes as well as dyes that are known in the art as being suitable for tinting plastic articles, such as PVC or polyamide articles. Examples of suitable disperse dyes include, but are not limited to, Disperse Blue #3, Disperse Blue #14, Disperse Yellow #3, Disperse Red #13 and Disperse Red #17. The classification and designation of the static dyes are recited herein in accordance with "The Colour Index", 3$^{rd}$ edition published jointly by the Society of Dyes and Colors and the American Association of Textile Chemists and Colorists (1971). The term static dye as used herein optionally includes mixtures of static dyes.

Illustrative examples of static dyes include the water-insoluble azo, diphenylamine and anthraquinone compounds. Illustrative examples include acetate dyes, dispersed acetate dyes, dispersion dyes and dispersol dyes, such as are disclosed in Colour Index, 3$^{rd}$ edition, vol. 2, The Society of Dyers and Colourists, 1971, pp. 2479 and pp. 2187-2743, respectively. Specific examples of dispersal dyes include Solvent Blue 59 (9,10-Anthracenedione, 1,4-bis(ethylamino)-), Solvent Red 111 (9,10-Anthracenedione, 1-(methylamino)-), Solvent Yellow 160:1 (3-(5-Chloro-2-benzoxazolyl)-7-(diethylamino)-2H-1-benzopyran-2-one), Disperse Orange 47 (1H-Indole-5-carboxylicacid,2-[2-(1,5-dihydro-3-methyl-5-oxo-1-phenyl-4H-pyrazol-4-ylidene) ethylidene]-2,3-dihydro-1,3,3-trimethyl-methyl ester), Disperse Yellow 3 (Acetamide, N-[4-[2-(2-hydroxy-5-methylphenyl)diazenyl]phenyl]-), Solvent Violet 26 (1,4-Diamino-2,3-diphenoxyanthraquinone), and Disperse Red 1 (4-[(2-Hydroxyethyl)ethylamino]-4'-nitroazobenzene). Other dyes are illustratively those additional dyes found in U.S. Pat. No. 7,175,675 and references cited therein.

In other aspects, an additive material is a weatherability enhancer, sometimes referred to herein as an anti-weathering agent. As used herein, the term "weatherability enhancer" is a material that promotes improved weatherability to the polymer. For example, light stabilizers promote improved UV or other light weatherability to the polymer. As used herein, the term "light stabilizer" is meant to include molecules that have functionality of absorbing UV light, or scavenging free radicals. A UV absorber absorbs UV light by changing the energy to heat that is dissipated through the material. A radical scavenger light stabilizer (e.g., a sterically hindered amine light scavenger (HAL S)) chemically reacts with a free radical. A light stabilizer as used herein is optionally a UV absorber, a radical scavenger, or both. Optionally, a light stabilizer is not a radical scavenger.

A UV absorber absorbs UV light and changes the energy to heat that is dissipated through the material. Illustrative examples of UV absorbers include a benzophenone, a benzotriazole, a hydrozyphenyltriazine, an oxalic anilide, or a combination thereof. Additional examples of UV absorbers are found in U.S. Pat. No. 5,559,163, and U.S. Patent Application Publication No: 2009/0258978. Some aspects of the invention include the UV absorber TINUVIN 384-2 that is a mixture of C$_{7-9}$ ester of [3-2h-benzotriazol-2-yl)-5-(1,1-dimethylethyl)-4-hydroxyphenyl)]-propionic acid (herein tinuvin 384-2), TINUVIN 1130 (methyl 3-[3-(benzotriazol-2-yl)-5-tert-butyl-4-hydroxyphenyl]propanoate) (herein tinuvin 1130), or UV416 (2-(4-Benzoyl-3-hydroxyphenoxy) ethyl acrylate).

A radical scavenger light stabilizer (e.g., a sterically hindered amine light scavenger (HALS)) chemically reacts with a free radical. Examples of a HALS include the ester derivatives of a decanedioic acid, such as a HALS I [bis(1,2,2,6,6,-pentamethyl-4-poperidinyl)ester] and/or a HALS II [bis(2,2,6,6,-tetramethyl-1-isooctyloxy-4-piperidinyl)ester].

A light stabilizer, when present is optionally provided at a concentration of 0.01 weight % to 1.2 weight % or any value or range therebetween, optionally 0.15 weight % to 0.3 weight %.

In some aspects, an additive is an anti-static agent. An anti-static agent serves to attract moisture from the air creating a polymer with more surface conductivity thereby dissipating static charges. An anti-static agent is optionally one or more of amines, quaternary ammonium compounds, organic phosphates, and polyethylene glycol esters. In some aspects, an anti-static agent is stearamidopropyldimethyl-2-hydroxyethylammonium nitrate (CYASTAT SN from Cytec Indus. Inc., Woodland Park, NJ).

In some aspects, an additive is an antioxidant. It is common for polymer materials to degrade by chemical reactions with oxygen that break the polymer bonds, often to a point where the material becomes physically weak. An antioxidant may work to stop or terminate the oxidative reactions, or may function to neutralize reactive materials that lead to additional cycles of oxidation. Known antioxidants may be infused into a polymer as an additive. Optionally, an antioxidant is phenolic, amine, phosphite, thioester, or any combination thereof.

An additive is optionally added to an infusion fluid in the form of dry particles with a maximum linear dimension, optionally diameter. A particle maximum linear dimension is optionally 500 micrometers (μm). In some aspects, a reduced maximum particle linear dimension is used. Optionally, a maximum linear particle dimension is 100 μm, optionally 10 μm, optionally 1 μm, optionally 500 nanometers (nm), optionally 100 nm. A maximum linear particle dimension is optionally 1 μm or less. A maximum linear particle dimension is optionally from 100 nm to 1 μm, optionally 100 nm to 500 nm. When particles of additive are supplied in larger form, the particle size is reduced by methods known in the art, illustratively by subjecting the particles to grinding, milling, or other process. Optionally, particles are subjected to ball milling.

An infused polymer is optionally formed by employing infusion techniques from any of several processes. In some aspects, an infused polymer is formed by employing infusing techniques as described in U.S. Pat. Nos. 6,733,543; 6,749,646; 6,929,666; 6,949,127; 6,994,735; 7,094,263; 7,175,675; 7,504,054; 7,921,680; or 8,206,463. In some aspects, an infused polymer is formed by employing infusing techniques as described in: U.S. Patent Application Publication Nos.: 2008/0067124; 2009/0297829; 2009/0297830; or 2009/0089942.

An infusion agent is optionally an oxidizing agent, a free radical precursor, or a compound having the formula of Formula I:

$$R^1-[(O(CH_2)_m)_n-]OR^2 \quad (I)$$

wherein $R^2$ and W are each independently H or a $C_{1-18}$ alkyl, benzyl, benzoyl, or phenyl; n is 1, 2 or 3; and m is any value from 1 to 35. In some aspects, m is 1 to 12. In some aspects, m is 1. Optionally, $R^1$ denotes H. Optionally, $R^1$ denotes butyl and $R^2$ denotes H. An aromatic $R^1$ or $R^2$ group of Formula I is optionally substituted with 1 to 5 groups selected from halo groups (e.g., chloro, bromo and fluoro), linear or branched $C_1$-$C_9$ alkyl groups (e.g., methyl, ethyl, propyl, butyl, pentyl, hexyl, heptyl, octyl and nonyl), and aromatic groups (e.g., phenyl).

Specific examples of an infusion agent according to Formula I include 2-methoxyethanol, 2-ethoxyethanol, 2-propoxyethanol, 2-isopropoxyethanol, 2-butoxyethanol, 2-phenoxyethanol, 2-benzyloxy ethanol, 2-(2-methoxyethoxy)ethanol, 2-(2-ethoxyethoxy)ethanol, 2-(2-butoxyethoxy)ethanol, dimethoxyethane, diethoxyethane, and dibutoxyethane, ethylene glycol butyl ether, diethylene glycol ethylether, diethylene glycol butylether, propylene glycol propylether, dipropylene glycol propyl ether and tripropylene glycol propylether, or combinations thereof.

The infusion agent is typically present in the infusion fluid in an amount of less than or equal to 30 percent by weight, optionally less than or equal to 25 percent by weight, optionally less than or equal to 20 percent by weight. The infusion agent is optionally present in the solution in an amount of at least 10 percent by weight, optionally at least 15 percent by weight, optionally at least 17 percent by weight. The infusion agent may be present in the solution in an amount ranging from 10 to 30 percent by weight or any value or range therebetween. For example, the infusion agent is optionally present in the solution in an amount from 10 to 30 percent by weight, optionally from 15 to 25 percent by weight, optionally in an amount of from 17 to 20 percent by weight. The percent weights being based on the total weight of the infusion fluid.

An infusion fluid optionally includes one or more infusion agents. Optionally, an infusion fluid includes 1, 2, 3, 4, 5, 6, or more infusion agents. In some aspects, when more than one infusion agent is present in an infusion fluid, there may be infusion agents of more than one type. In some aspects, a first infusion agent is an agent of Formula I, and a second infusion agent is a diol of Formula II:

H—[O(CH$_2$)$_m$)$_n$—]OH    (II)

wherein n is 1, 2 or 3; and m is any value from 1 to 35. In some aspects, m is 1 to 12. In some aspects, m is any value from 2 to 4. Optionally, m is any value from 2 to 4 and n is 1, 2, or 3. Illustrative agents of Formula II include diethylene glycol, triethylene glycol and 1,4 butanediol.

An infusion agent is optionally present in an infusion fluid at a concentration of 2.5 to 20, optionally 5 to 12.5, optionally 7.5 to 10 pbw, or any range of values therebetween. A second infusion agent is optionally present in an amount identical to a first infusion agent. Optionally, a second infusion agent is present in an amount of 5 to 30, preferably 10 to 25, most preferably 15 to 20 pbw, or any range of values therebetween.

An infusion fluid optionally includes one or more emulsifiers. Illustrative examples of an emulsifier include ionic or non-ionic emulsifiers, or mixtures thereof. Illustrative examples of an anionic emulsifier include: amine salts or alkali salts of carboxylic, sulfamic or phosphoric acids, for example, sodium lauryl sulfate, ammonium lauryl sulfate, lignosulfonic acid salts, ethylene diamine tetra acetic acid (EDTA) sodium salts, and acid salts of amines, such as, laurylamine hydrochloride or poly(oxy-1,2-ethanediyl), α-sulfo-omega-hydroxy ether with phenol 1-(methylphenyl) ethyl derivative ammonium salts. An emulsifier is optionally an amphoteric emulsifier illustratively: lauryl sulfobetaine; dihydroxy ethylalkyl betaine; amido betaine based on coconut acids; disodium N-lauryl amino propionate; or the sodium salts of dicarboxylic acid coconut derivatives. Typical non-ionic emulsifiers include ethoxylated or propoxylated alkyl or aryl phenolic compounds, such as octylphenoxypolyethyleneoxyethanol. A specific emulsifier used is diethylene glycol.

An emulsifier is optionally present in an infusion fluid in an amount from 0 to 15 weight percent, optionally 7 to 15 weight percent, optionally 10 to 15 weight percent, optionally 0.5 to 5 weight percent, optionally 3 to 4 weight percent, or any range of values therebetween.

An infusion fluid optionally includes one or more surfactants.

An infusion fluid is optionally at ambient temperature (approximately 25° C.) or heated above ambient temperature. In some aspects, an infusion process includes heating a polymer alone or in the presence of an infusion fluid where heating is to a temperature below the melting temperature of the polymer material. Optionally, an infusion fluid is pre-heated or heated prior to or in the presence of a polymer, optionally to any infusion temperature less than 100° C.

The systems described herein may be used to infuse an additive into a linear polymer substrate by a process that may include infusing a polymer at an infusion temperature. The infusion temperature is optionally below the melting temperature of the polymer material. An infusion temperature is the temperature of the polymer material during the infusion process. In some aspects, an infusion temperature is at or above the glass transition temperature (Tg). Optionally, an infusion temperature is at or above the Tg and below the melting temperature. For amorphous polymer materials without true melting points, an infusion temperature is above the Tg but is not so high that the article shape is affected. Optionally, an infusion temperature is between 81° C. and 91° C. Illustratively, for a polyamide polymer material an infusion temperature may be 90° C. to 99° C. Illustratively, for a PVC polymer material an infusion temperature may be 75° C. to 90° C. It is appreciated that polymers that may have a lower heat distortion temperature may be infused at a lower temperature. As one example, an infusion temperature of a polyurethane may be about 60° C. An infusion time is optionally less than 1 minute, optionally from 0.01 second to 1 minute, or any value or range therebetween.

The infused polymer is optionally formed by immersing a polymer material in an infusion fluid for an infusion time where the immersing, mixing or otherwise contacting the polymer material with an infusion fluid in an element of an infusion system as provide herein. In some aspects, spraying an infusion fluid on a polymer is excluded. An infusion time is optionally any time from <1 second to 120 minutes, or more. In some aspects, an infusion time is optionally from <1 second to 30 minutes, optionally from <1 second to 20 minutes, optionally from 1 second to 10 minutes, optionally from 1 second to 1 minute, optionally from 5 seconds to 1 minute, optionally from 5 seconds to 30 seconds, optionally from 10 seconds to 20 seconds, optionally 2 seconds to 10 seconds, optionally 3 seconds to 6 seconds, or any range of values therebetween. An infusion time is optionally 1, 2, 3, 4, 5, 6, 7, 8, 9, 10, 15, 20, 25, 30, 35, 40, 45, 50, 55 or 60 milliseconds. An infusion time is optionally 1, 2, 3, 4, 5, 6, 7, 8, 9, 10, 15, 20, 25, or 30 seconds. An infusion time is optionally any range formed by the bounds of the explicitly disclosed values, for example, 15 milliseconds to 20 seconds.

A polymer is optionally colored in a system substantially as depicted in the figures or otherwise described herein. FIGS. 2, 3A, 3B, and 3C depicts an example linear substrate infusion compartment as part of a system. It is noted that FIGS. 2 and 3 do not illustrate all components of the linear substrate infusion compartment as part of a system with fluid piping, controllers, and valves, for example, omitted. Instead, FIGS. 2, 3A, 3B, and 3C provide a generalized overview of an example linear substrate infusion compartment as part of a system.

FIGS. 2, 3A, 3B, and 3C illustrate a schematic layout of the interconnectivity of an exemplary linear substrate infusion system 10. A generalized linear substrate infusion system 10 configured for two infusion options includes a first dye supply 20 for providing a first colored dye (or other additive) and optionally a second dye supply 30 for providing a second colored dye (or other additive). The first dye supply 20 and the second dye supply 30 are attached to a first process tank 22 and a second process tank 32 respectively. The process tanks 22, 32 provide a reservoir of colored dye for circulation through the linear substrate infusion system 10. The first process tank 22 and the second process tank 32 each are fluidly connected to an infusion compartment 40. The infusion compartment 40 contacts the desired color dye with the linear substrate. Upon exiting the infusion compartment 40 the colored dye is returned to the first process tank 22 or the second process tank 32 for the respective color from which the colored dye originated. Propulsion of the first colored dye and the second colored dye is provided by a first dye pump 24 and a second dye pump 34 respectively.

Throughout this disclosure the linear substrate infusion system 10 is referenced as having a first colored dye and a second colored dye. Limitation of discussion to two colored dyes is for ease of discussion and simplicity. It will be appreciated that aspects of the linear substrate infusion system 10 may include 3 or more colored dyes by replicating the associated systems of the first or second colored dye for each additional colored dye added to the linear substrate infusion system 10. Further, while the description is primarily directed to the infusion of colored dye(s) such is presented for illustrative and descriptive purposes alone. The disclosure is equally applicable to infusion of other additive molecules with coloring or imparting other properties to the polymer material. Illustratively, other additive materials suitable for infusion, as discussed supra, include, but are not limited to, anti-weathering agents (illustratively, a light stabilizer), anti-static, flame retardant, lubricant, antioxidant, or other additive molecule. As such, unless otherwise indicated, infusion of a dye is equally appreciated to describe infusion of one or more other types of additive materials.

The linear substrate infusion system 10 is unique in providing the ability to change the color and/or additive infused in the linear substrate during processing of the linear substrate. Specifically, the linear substrate infusion system 10 may be converted from creating a first color linear substrate to creating a second color linear substrate while the system is operating (for example, a red linear substrate and then a blue linear substrate). There is no requirement to terminate the linear substrate coloring operation, clean the equipment, and re-feed the linear substrate into the equipment when a color change is desired. A single run of linear substrate, from a pre-manufactured spool or as the output of a linear substrate forming line, may have the color changed from red to blue, for example, without stopping the processing line. For example, linear substrate may be provided from an extruder at a constant speed of 150 feet per minute (fpm) based on the operating speed of the extruder. With a conversion of the linear substrate infusion system 10 from the first color to the second color being completed in 30 seconds to 2 minutes, a mere 75 feet to 300 feet of scrap linear substrate may be generated during the color conversion. If the speed of the extruder or feed from a spool of linear substrate is reduced during the color conversion the total length of scrap may be reduced.

In one or more aspects, the first process tank 22 and the second process tank 32 are connected to respective heating loops. The heating loops raise the temperature of the first colored dye and the second colored dye to the desired set point for introduction to the infusion compartment 40 and coloring of the linear substrate. Each heating loop may comprise an in-line heater to raise the temperature of the first colored dye or the second colored dye respectively during passage of the first colored dye or the second colored dye through the heating loop. In further aspects, the heating loops are approximately 3 feet in length and it will be appreciated that the length of the heating loop in practice may be adjusted to account for flow rates of colored dyes, the efficiency of the heater(s), and other process restraints. In further aspects, flow through the heating loops is maintained at approximately 35 gallons per minute (gpm) with an 8 kilowatt (kW) heater. It will be appreciated that flow rates of 10 gpm, 20 gpm, 40 gpm, 80 gpm, and beyond, and any range of values therebetween, for example, may be utilized as the power of the heater and desired temperature rise of the colored dyes changes.

In one or more aspects, the first process tank 22 and the second process tank 32 are heated tanks. In further aspects, the first process tank 22 and the second process tank 32 each comprise an agitator or mixer to maintain a uniform temperature and mixture throughout the colored dye within the first process tank 22 or the second process tank 32.

In further aspects, a filter may be included in the heating loop and/or between the heating loop and infusion compartment 40 and/or between the infusion compartment 40 and the process tank 22, 32. The filter serves to filter and remove deposits or foreign particles that enter the colored dye during the coloring operation. For example, flaking or particles from a nylon wire jacket may be removed by the filter. In further aspects, the filters are 316 stainless steel bag filters of trade size 3.

The heating loop allows circulation of the colored dye when not being provided to the infusion compartment 40. The heating loop for the first colored dye includes a first colored dye diverter valve 26 and the heating loop for the second colored dye includes a second colored dye diverter valve 36. The first colored dye diverter valve 26 and the second colored dye diverter valve 36 direct the colored dye on a recirculation pathway in the heating loop when in a first position and direct the colored dye away from the heating loop to the infusion compartment 40 when in a second position.

Figure 2:
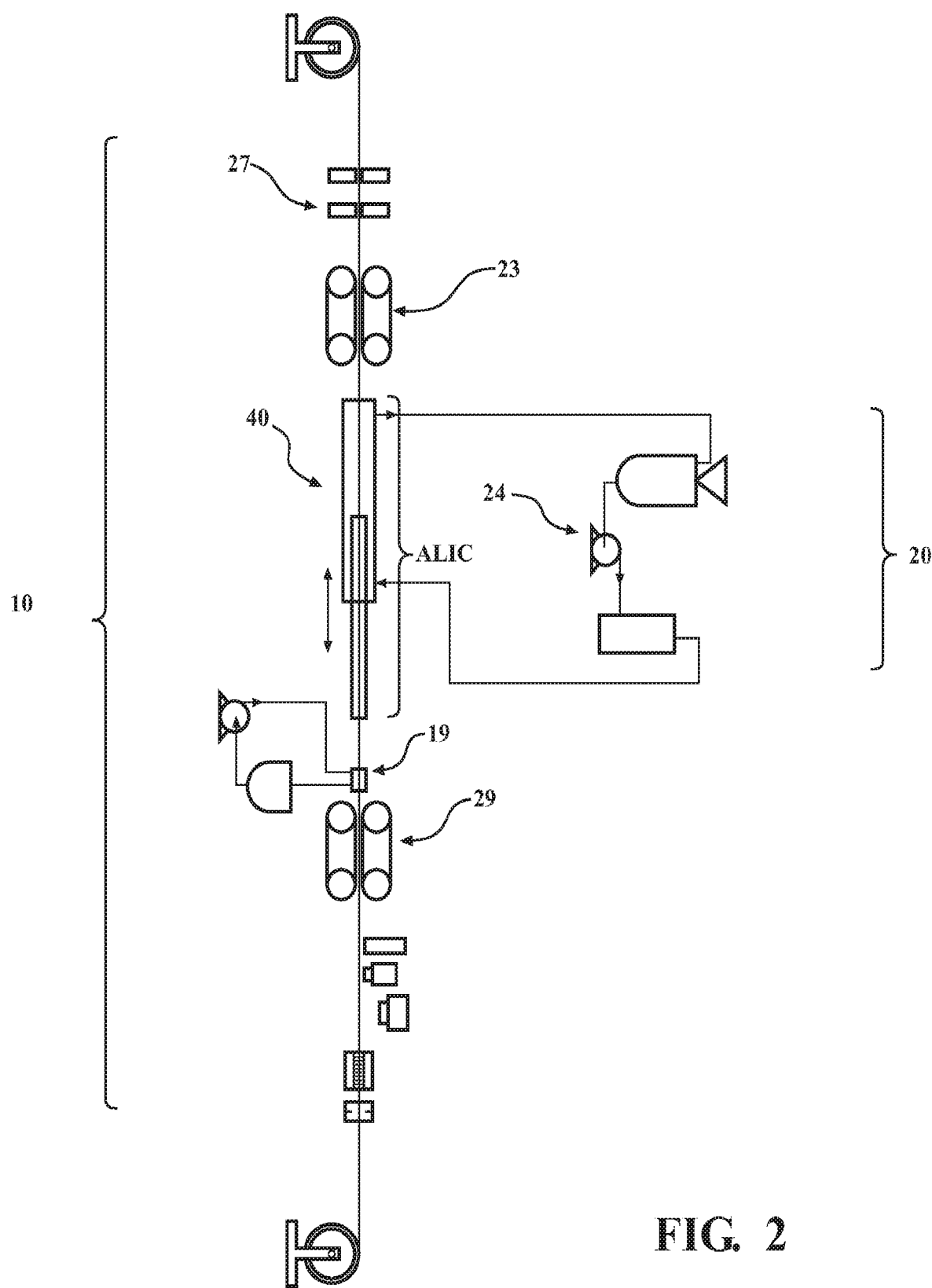
FIG. 2 illustrates a schematic of a linear substrate infusion compartment as part of a system, according to one or more aspects described herein.

Referring to FIG. 2, a linear substrate infusion system may include a substrate delivery mechanism 23 to remove a linear substrate from a reel or other source. A substrate delivery mechanism may be a capstan or other system suitable for such needs. The substrate delivery mechanism may serve to regulate the rate of linear substrate entry into the infusion compartment 40. Also upstream of an infusion compartment 40, an infusion system may include a gauge 27 for determining the diameter of the linear substrate. Upon exit from the infusion compartment 40, a linear substrate may pass through one or more a rinsing stations 19 that may include a compartment through which the linear substrate passes or may simply be a location in which the linear substrate is subjected to a rinsing fluid. The rinsing fluid is optionally cycled and optionally filtered such that clean rinsing fluid may be contacted to the linear substrate. In some aspects, a substrate pull out mechanism 29 is present to guide linear substrate toward a storage location following infusion. Optional aspects for post infusion processing and quality control may include a device for measuring linear substrate speed and/or measuring and recording the amount of linear substrate that has been infused, a quality control device for monitoring the quality of the infusion process, optionally optically, electrically, or by other method depending on the type of additive(s) infused into the substrate, and optionally a marking device such as a laser, printer, or other device for imparting markings on the surface of the linear substrate following infusion. A cutter may be provided to terminate a length of linear substrate such as when a storage location is full, an ordered or otherwise desired amount of linear substrate has been infused, or other.

Figure 3A:
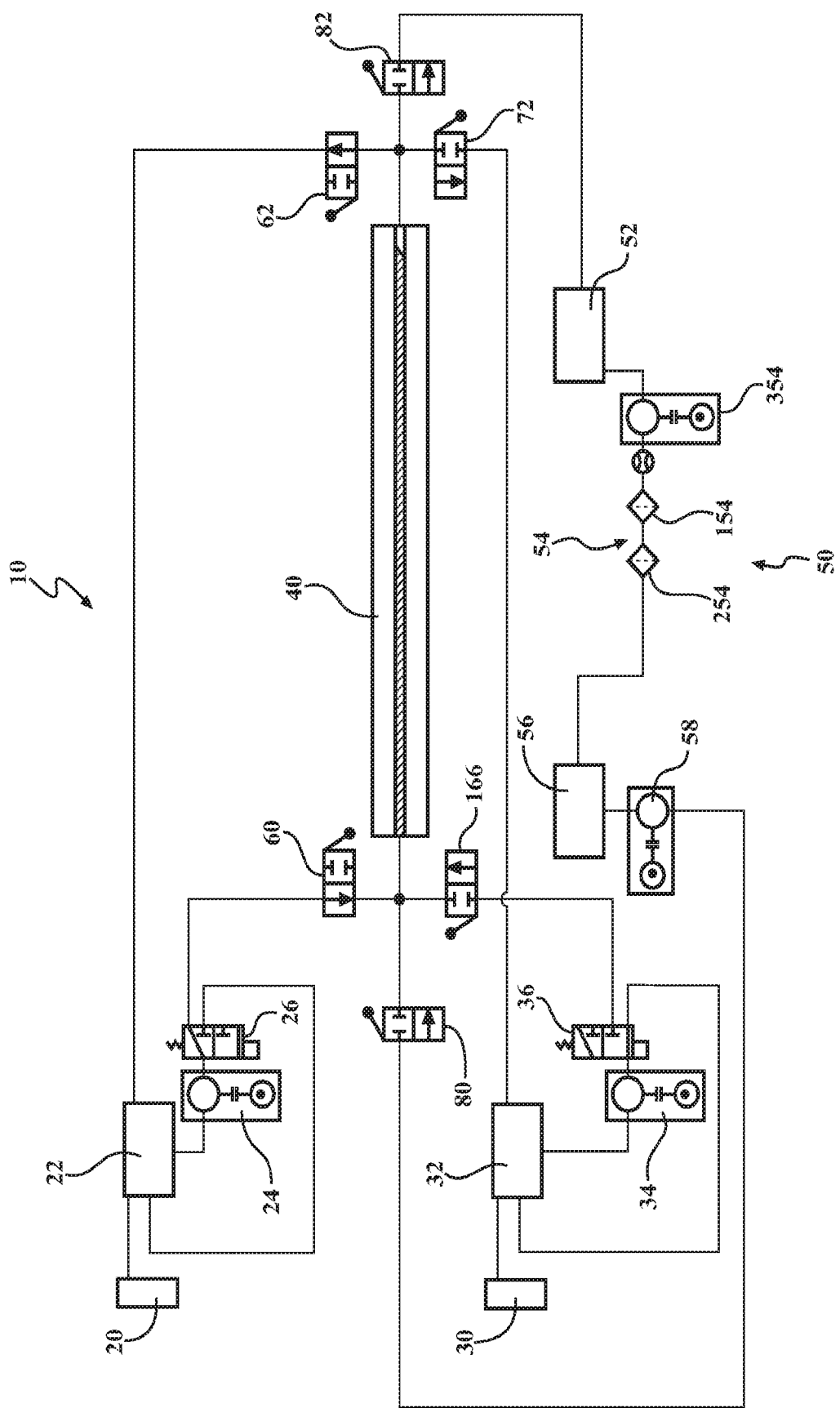
FIG. 3A schematically depicts a linear substrate infusion compartment as part of a system configured for infusion of a first colored dye, according to one or more aspects described herein.
Figure 3B:
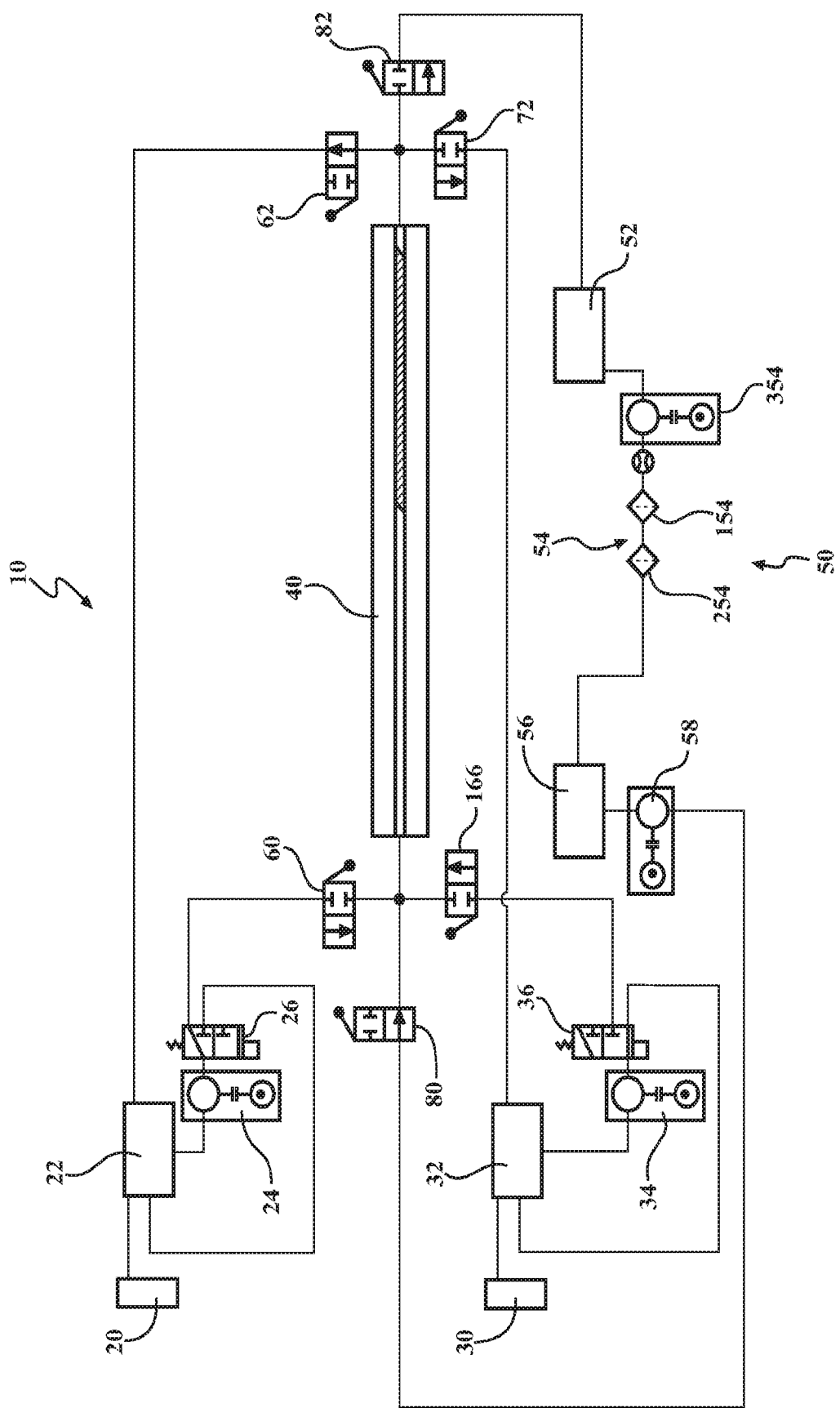
FIG. 3B schematically depicts a linear substrate infusion compartment as a part of a system configured for change over from a first colored dye to a second colored dye, according to one or more aspects described herein.
Figure 3C:
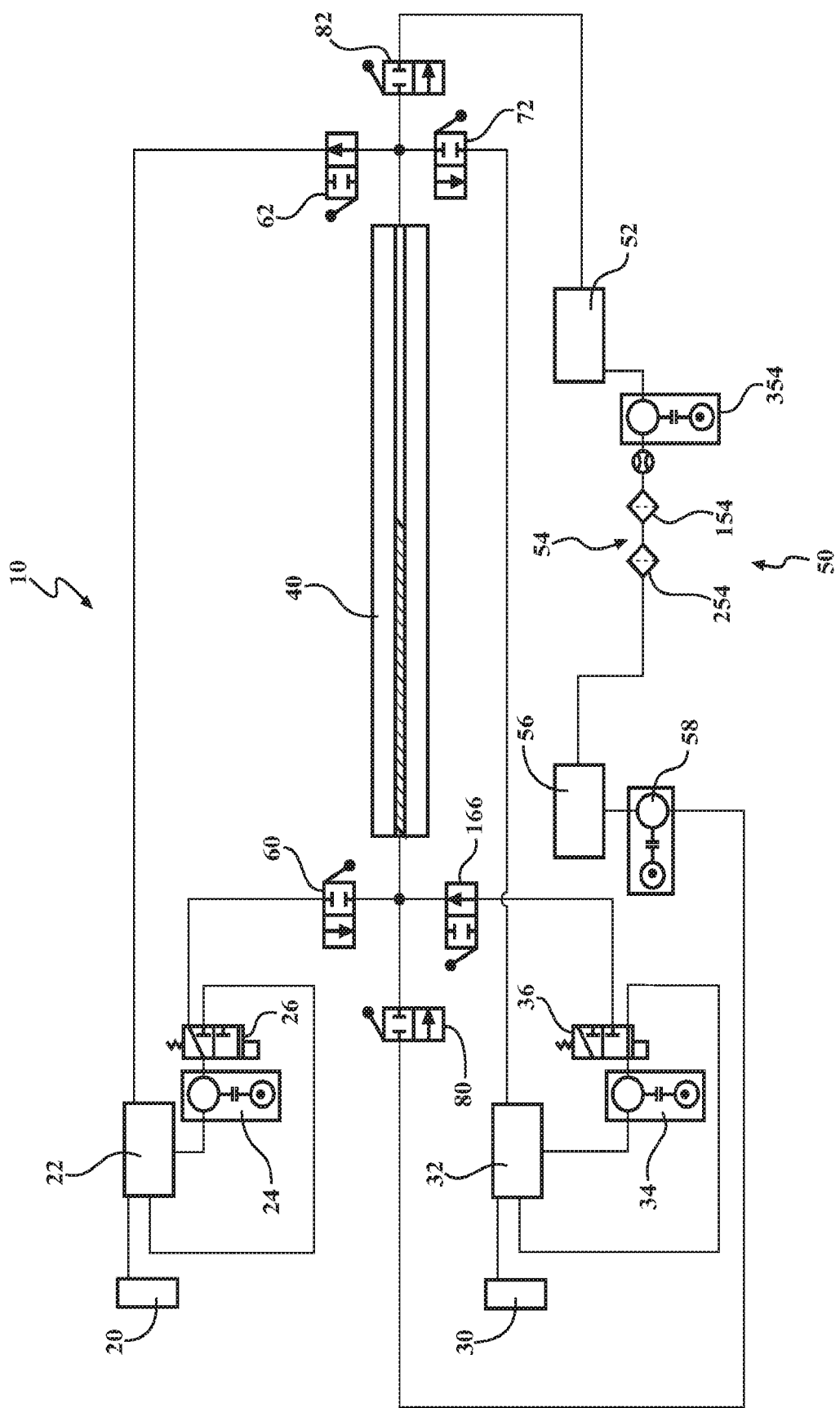
FIG. 3C schematically depicts a linear substrate infusion compartment as part of a system configured for infusion of a second colored dye, according to one or more aspects described herein.

Referring to FIGS. 3A, 3B, and 3C which illustrate a schematic layout of various aspects of a generalized linear substrate infusion system 10, the linear substrate infusion system 10 comprises a solvent loop 50. The solvent loop 50 is fluidly connected to the infusion compartment 40. The solvent loop 50 provides clean solvent to flush the infusion compartment 40 when changing from one colored dye to a different colored dye. Flushing the infusion compartment 40 prevents improper coloration of the wire and contamination of the colored dyes in the first process tank 22 and the second process tank 32. The solvent loop 50 includes a solvent recovery tank 52, a filter system 54, a clean solvent tank 56, and at least one supply pump 58.

The solvent recovery tank 52 is fluidly connected to an outlet of the infusion compartment 40. Solvent, having passed through the infusion compartment 40, is recovered in the solvent recovery tank 52 for further processing and cleaning. Optionally, the solvent recovery tank 52 is 60 gallons. It will be appreciated that the solvent recovery tank 52 may be any of various sizes scaled according to the overall process size and solvent volume within the process. In aspects, the solvent recovery tank 52 is stainless steel, for example, 316 stainless steel.

The filter system 54, as a subcomponent of the solvent loop 50, removes colored dye and other contaminants from the spent solvent in the solvent recovery tank 52. In one or more aspects, the filter system 54 comprises a bag filter 154 and a carbon filter 254 fluidly connected to the solvent recovery tank 52. The bag filter 154 functions to remove solid or particulate materials from the spent solvent. Similarly, the carbon filter 254 functions to remove residual dissolved colored dye from the spent solvent. In aspects, the bag filter 154 is a 5 micrometer (μm) filter bag. In further aspects, the carbon filter 254 is a wastewater reclaim carbon filter. The filter system 54 may also comprise a filter pump 354 to provide a head pressure for transit of the spent solvent through the bag filter 154 and/or carbon filter 254.

Passage of the spent solvent through the filter system 54 returns the solvent to a clean state. The cleaned solvent is conveyed to the clean solvent tank 56 which is fluidly connected to the filter system 54. The clean solvent tank 56 serves as a reservoir of solvent to be provided to the infusion compartment 40 during transitions from one colored dye to a different colored dye. In at least one aspect, the clean solvent tank 56 is 60 gallons. It will be appreciated that the clean solvent tank 56 may be any of various sizes scaled according to the overall process size and solvent volume within the process. In aspects, the clean solvent tank 56 is stainless steel, for example, 316 stainless steel. The clean solvent tank 56 may optionally mirror the volume of the solvent recovery tank 52.

The clean solvent tank 56 is fluidly connected to an inlet of the infusion compartment 40. To convey the clean solvent from the clean solvent tank 56 to the infusion compartment 40, the at least one supply pump 58 is provided. The supply pump 58 provides motive force to convey the solvent to the infusion compartment 40, through the infusion compartment 40, and to the solvent recovery tank 52.

Further, the solvent loop 50 may include a solvent heater to raise the temperature of the solvent to the desired set point for introduction to the infusion compartment 40. In one or more aspects, an inline heater is provided between the clean solvent tank 56 and the infusion compartment 40 to heat the solvent in an on-demand fashion. The inline heater may have a power of approximately 8 kW to approximately 15 kW. The inline heater may optionally also have a power of 5 kw to 25 kw, 5 kw to 15 kW, 8 kW to 20 kw, or 1 kW to 50 kW, for example. In further aspects, an immersion heater is provided within the clean solvent tank 56 to heat and hold the bulk clean solvent within the clean solvent tank 56. In further aspects, a band heater is provided within the clean solvent tank 56 to heat and hold the bulk clean solvent within the clean solvent tank 56.

Figure 4A:
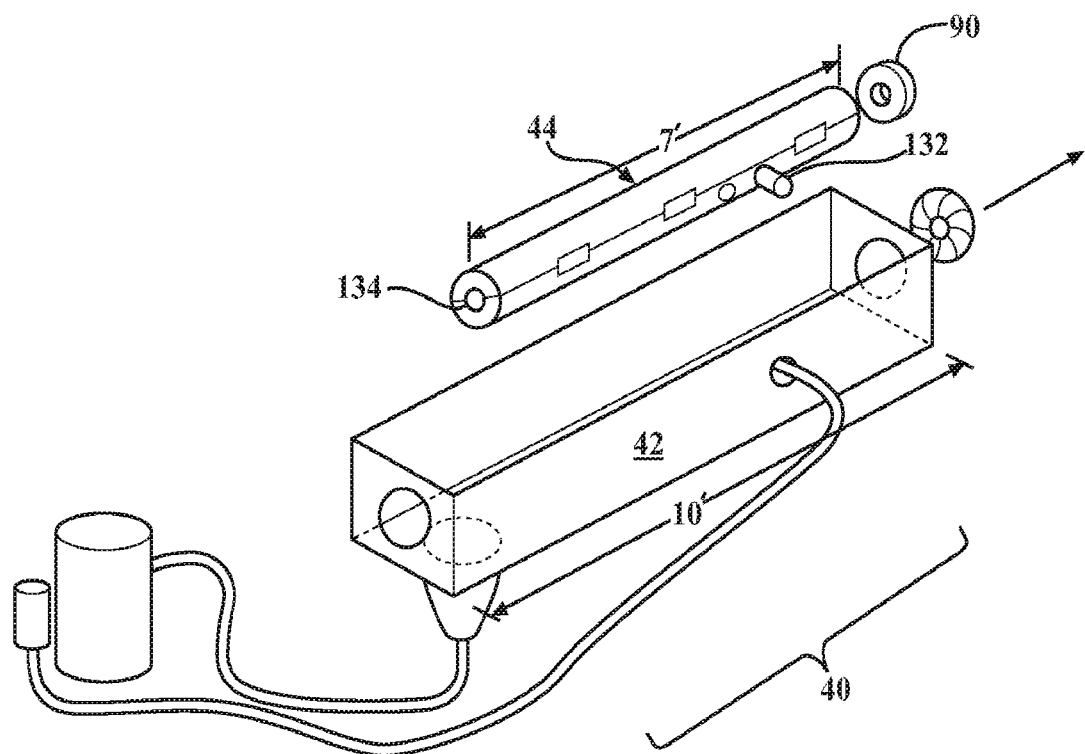
FIG. 4A illustrates a linear substrate infusion compartment as part of a system, according to one or more aspects described herein.
Figure 4B:
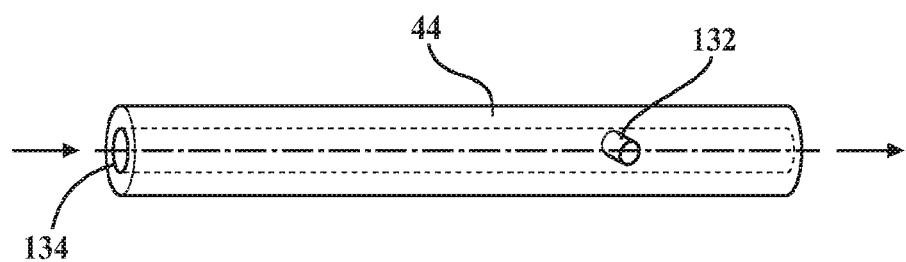
FIG. 4B illustrates a side view of components of FIG. 4A.

With reference to FIGS. 4A and 4B, an aspect of the infusion compartment 40 is illustrated for a single color system. The infusion compartment 40 includes a catch basin 42 and a processing barrel 44 where the infusion compartment may rest above or within the processing barrel. The catch basin 42 includes a drain in fluid communication with a colored dye reservoir (first process tank 22, second process tank 32). The processing barrel 44 includes an outer wall having opposing ends and an infusion chamber 102 defined therein. The processing barrel 44 further includes an infusion fluid inlet 132 and an infusion fluid outlet 134 as well as a linear substrate inlet 135 defining an inlet opening into the infusion chamber 102 coincident with the infusion fluid outlet 134 and a linear substrate outlet 136 defining an outlet opening out of the infusion chamber 102 and positioned at the opposite end of the processing barrel 44 as the linear substrate inlet. As shown in FIG. 4, the linear substrate outlet 136 defining an outlet opening out of the infusion chamber 102 and positioned at the opposite end of the processing barrel 44 as the linear substrate inlet. As shown in FIG. 4A, the linear substrate inlet 135 and the linear substrate outlet 136 are coupled to the outer wall and may be moveably connected with respect to each other, and at least one of the linear substrate inlet 135 and the linear substrate outlet 136 are located between opposing ends of the outer wall.

As shown in FIGS. 4A and 4B, relative to one another, the infusion fluid inlet 132 is positioned closer to the linear substrate outlet 136 of the processing barrel and the infusion fluid outlet 134 is positioned closer to the linear substrate inlet 135 of the processing barrel. The processing barrel 44 has a hollow shaft configured to allow passage in a first direction of a linear substrate and flow of an infusion fluid in a second counterflow direction substantially opposite the first direction. The counterflow is essential in some aspects. In other aspects coincident flow is used (flow in the same direction as linear substrate travel). In some aspects, the processing barrel 44 is split along its length to form two hinged pieces in a clamshell arrangement. The clamshell arrangement eases feeding and insertion of the linear substrate into the processing barrel 44.

As used throughout the description of the various aspects, the term "processing barrel" or "barrel" is not intended to be interpreted as requiring any particular cross-sectional or outward shape. Accordingly, the radial cross-sectional shape of the various aspects of the processing barrel, may be, without limitation, circular, round, rounded, elliptical, oval, or polygonal. Similarly, the longitudinal cross-sectional and/or outward shape of the aspects of the processing barrel may be, without limitation, outwardly bowed, inwardly bowed, curved, straight, cylindrical or non-cylindrical.

The colored dye reservoir is in fluid communication with the infusion fluid inlet 132 on the processing barrel 44 and feeds colored dye to the processing barrel 44 and more specifically to the hollow center of the processing barrel 44. In an aspect, the processing barrel 44 is 7 feet in length and the infusion fluid inlet 132 is positioned 5 feet from the infusion fluid outlet 134. Further, the hollow center in at least one aspect is optionally approximately 1.5" in diameter to allow passage of a linear substrate therethrough. This arrangement positions the infusion fluid inlet 132 approximately 2 feet from the linear substrate outlet. The processing barrel 44 is optionally positioned with a tilt to allow the infusion fluid to drain by gravity. In an aspect, the processing barrel 44 is positioned at an approximately 3° angle with the infusion fluid outlet 134 lower than the infusion fluid inlet 132. In operation, colored dye and/or other additives (infusion fluid) are provided to the infusion fluid inlet 132 in the infusion fluid while linear substrate is passed through the processing barrel 44 from the linear substrate inlet to the linear substrate outlet. Optionally, gravity results in the colored dye flowing toward the infusion fluid outlet 134 and draining into the catch basin 42 for recycling back to the colored dye reservoir. In some aspects, colored dye is dragged upstream toward the linear substrate outlet by the counterflow travel of the linear substrate such that colored dye is also drained from the linear substrate outlet of the processing barrel 44.

Figure 5:
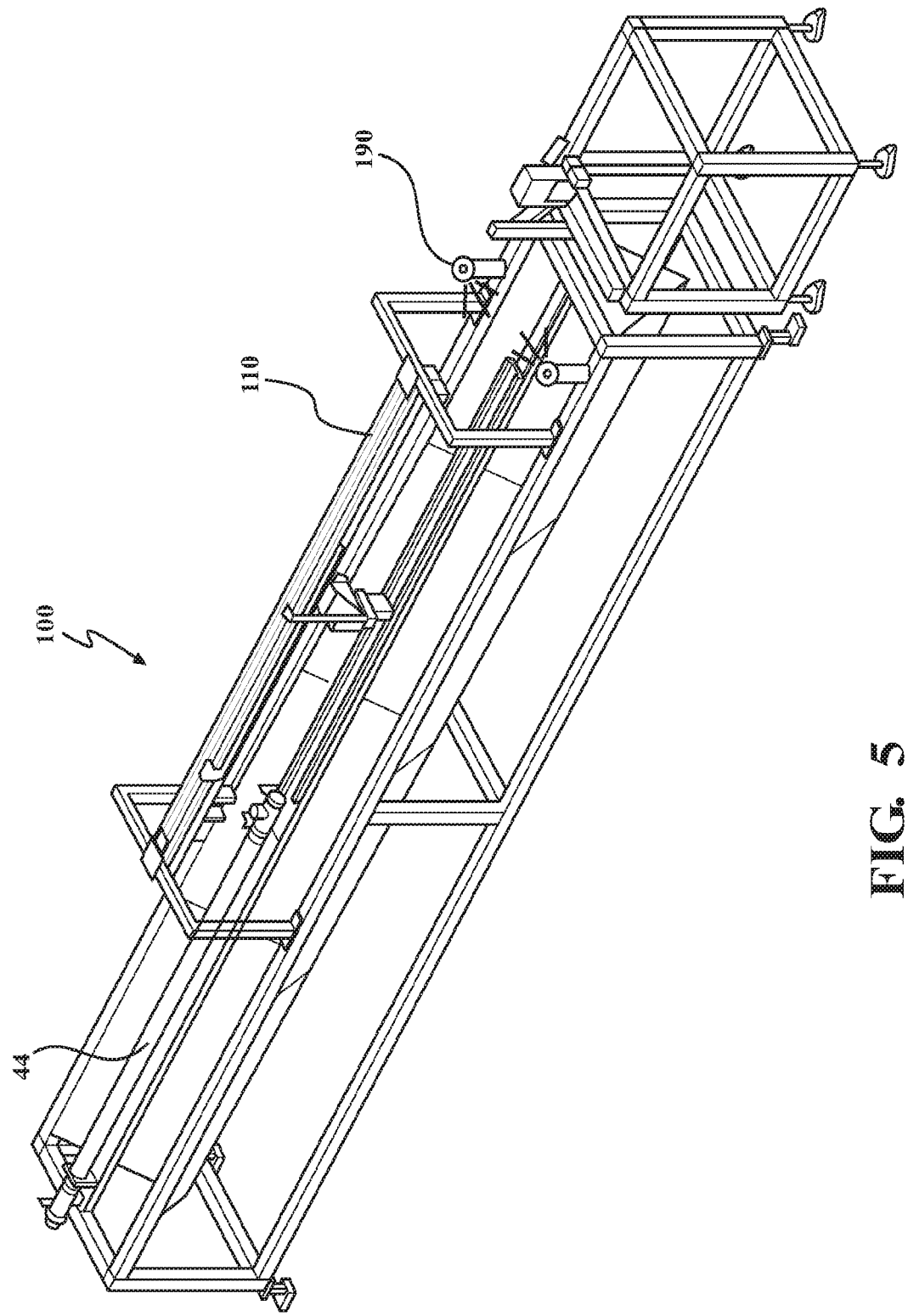
FIG. 5 illustrates a linear substrate infusion compartment as part of a system, according to one or more aspects described herein.

With reference to FIG. 5, in many aspects, the infusion compartment 40 comprises an adjustable length infusion cell (ALIC) 100. The adjustable length infusion cell 100 comprises the processing barrel 44 and a length adjustment assembly 110. The length adjustment assembly 110 functions to effect an adjustment in the length of the processing barrel 44.

In some aspects, the processing barrel 44 has an adjustable length. Adjusting the length of the processing barrel 44 allows the linear substrate to be exposed to the infusion fluid for varying lengths of time. As previously indicated, the longer the linear substrate is exposed to the infusion fluid and the dissolved colored dye in the infusion fluid, the more the dye (or other additive) in the infusion fluid transfers to the linear substrate. Increasing the length of the processing barrel 44 increases the exposure time of the linear substrate to the infusion fluid and results in more dye uptake and a more intense color during processing. Additionally, for a given linear substrate speed, adjusting the length of the processing barrel 44 provides functionality to adjust the residence time of the linear substrate in contact with the infusion fluid based on the uptake rate of the specific material of the linear substrate.

Figure 6A:
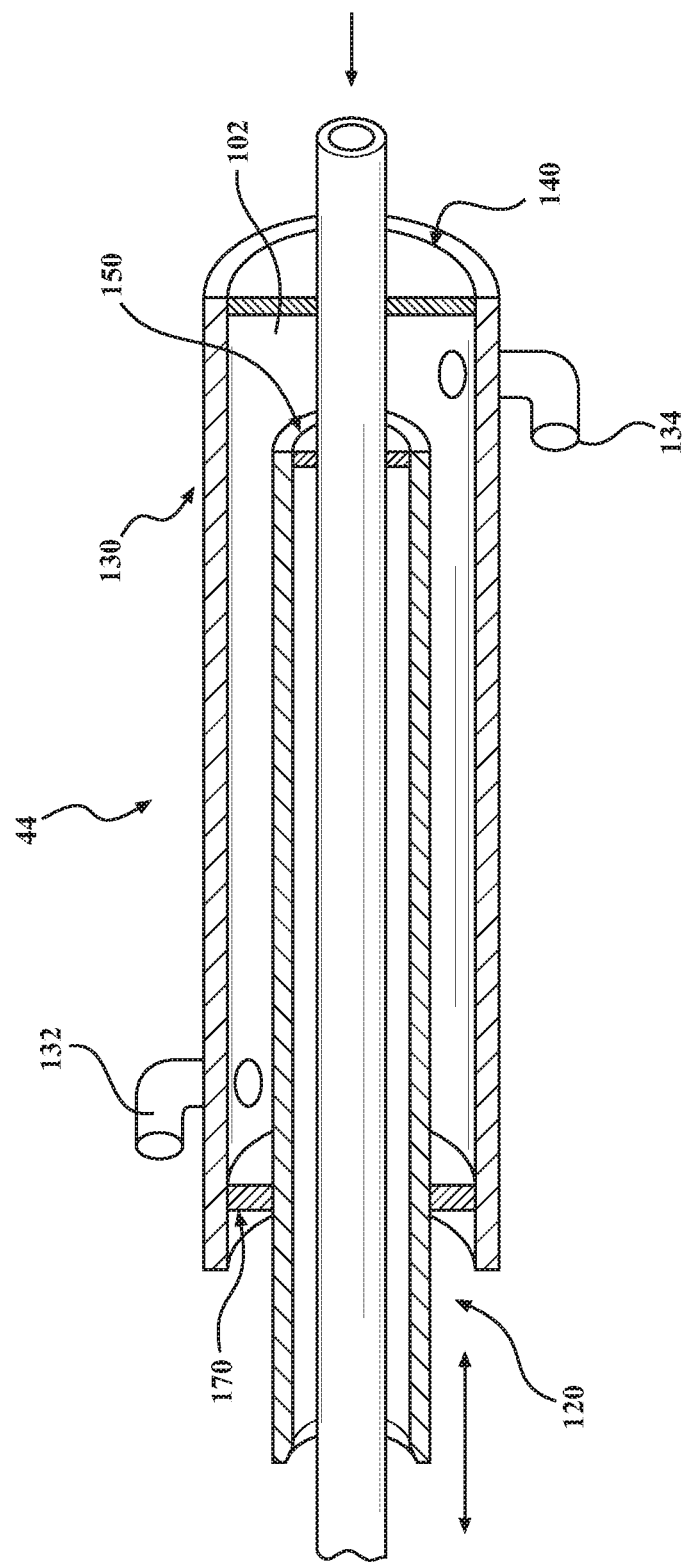
FIG. 6A illustrates a schematic of a cut view of a processing barrel, according to one or more aspects described herein.
Figure 6D:
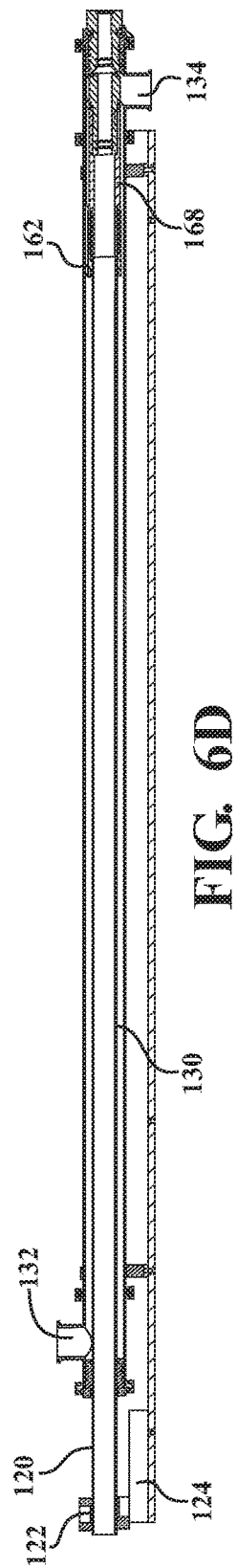
FIG. 6D illustrates a processing barrel, according to one or more aspects described herein.

With reference to FIGS. 6A, 6B, 6C, and 6D the processing barrel 44 with an adjustable length includes an inner processing vessel 120 and an outer processing vessel 130 which may include the outer wall of the processing barrel. The inner processing vessel 120 is axially moveable and nested within the outer processing vessel 130 with at least a portion of the infusion chamber defined therebetween. The moveably nested arrangement allows an exposure gap to extend and contract in length as the inner processing vessel 120 and the outer processing vessel 130 slide relative to each other in a longitudinal direction. The processing barrel 44 further includes an infusion fluid inlet 132 and an infusion fluid outlet 134 as well as an infeed seal 140, an inner seal 150, and a discharge seal 170. In some aspects, the linear substrate inlet and the linear substrate outlet include seals. For example, as depicted in FIG. 6A, the linear substrate inlet 135 may include the infeed seal 140 and the linear substrate outlet 136 may include the inner seal 150. The exposure gap is defined by the length within the infusion chamber between the linear substrate inlet 135 and the linear substrate outlet 136.

As shown in FIGS. 6A-6E, the linear substrate inlet 135 and the linear substrate outlet 136 are movable between a plurality of relative positions, each defining a different length of the exposure gap. In other words, the exposure gap is adjustable from a length of zero to greater than zero. A exposure gap is optionally adjustable from zero to the length of an outer processing vessel 130 between the discharge seal 170 and the infeed seal 140 or any length therebetween, being optionally incrementally adjustable or infinitely adjustable.

For example, in a first relative position, one of the linear substrate inlet 135 and the linear substrate outlet 136 are located between opposing ends of the outer wall, and the exposure gap has a length that is greater than zero, as depicted in FIG. 6A. The linear substrate inlet 135 and the linear substrate outlet 136 are coupled to the wall of the outer processing vessel 130 and are movably connected with respect to each other. Specifically, the linear substrate outlet 136 is coupled to the wall of the outer processing vessel 130 through the inner processing vessel 120 and the discharge seal 170. As depicted in FIG. 6A, the exposure gap is in fluid communication with the infusion chamber. However, in a second relative position one of the linear substrate inlet 135 and the linear substrate outlet 136 is in a different position than in the first relative position, and the exposure gap has a length that is different from the first length. For example, in the aspect depicted in FIG. 6A, the inner processing vessel 120 may be moved within the outer processing vessel 130 such that the infeed seal 140 and the inner seal 150 are in contact with one another. In such a configuration the exposure gap has a length of zero and the exposure gap is not in fluid communication with the infusion chamber.

In some aspects, the length of the exposure gap in the second relative position is less than about 50% of the length of the exposure gap in the first relative position. For example, the length of the exposure gap in the second relative position may be less than about 49%, 48%, 47%, 46%, 45%, 44%, 43%, 42%, 41%, 40%, 39%, 38%, 37%, 36%, 35%, 34%, 33%, 32%, 31%, 30%, 29%, 28%, 27%, 26%, 25%, 24%, 23%, 22%, 21%, 20%, 19%, 18%, 17%, 16%, 15%, 14%, 13%, 12%, 11%, 9%, 8%, 7%, 6%, 5%, 4%, 3%, 2%, 1%, or even 0% of the length of the exposure gap in the first relative position. In particular, the length of the exposure gap in the second relative position may be from about 0% to about 50%, from about 5% to about 45%, from about 10% to about 40%, from about 15% to about 35%, or from about 20% to about 30% of the length of the exposure gap in the first relative position.

The outer processing vessel 130 may be fixed and the inner processing vessel 120 may be able to travel in and out of the outer processing vessel 130 in a longitudinal fashion. The linear substrate travels inside both the inner processing vessel 120 and the outer processing vessel 130. An infusion chamber 102 is formed by the cavity created between the inner processing vessel 120 and the outer processing vessel 130. As the position of the inner processing vessel 120 is changed within the outer processing vessel 130, the length of the linear substrate exposed within the infusion chamber 102 is varied. The length of exposed linear substrate may vary from none (entirely unexposed) when the inner seal 150 substantially contacts the infeed seal 140, to a maximum length when the inner seal 150 substantially contacts the discharge seal 170. The maximum length of exposed linear substrate desired is determined by the rate of linear substrate feed and the infusion time required to achieve the desired infusion of the additives. The length of the outer processing vessel 130 can be selected to achieve the maximum desired length of exposed linear substrate as the length of the outer processing vessel 130 determines the length of exposed linear substrate when the inner processing vessel 120 is fully extended from the outer processing vessel 130 and an exposure gap is defined from where the linear substrate enters into the infusion chamber (the linear substrate inlet 135) to where the linear substrate exits the infusion chamber (the linear substrate outlet 136).

Figure 6E:
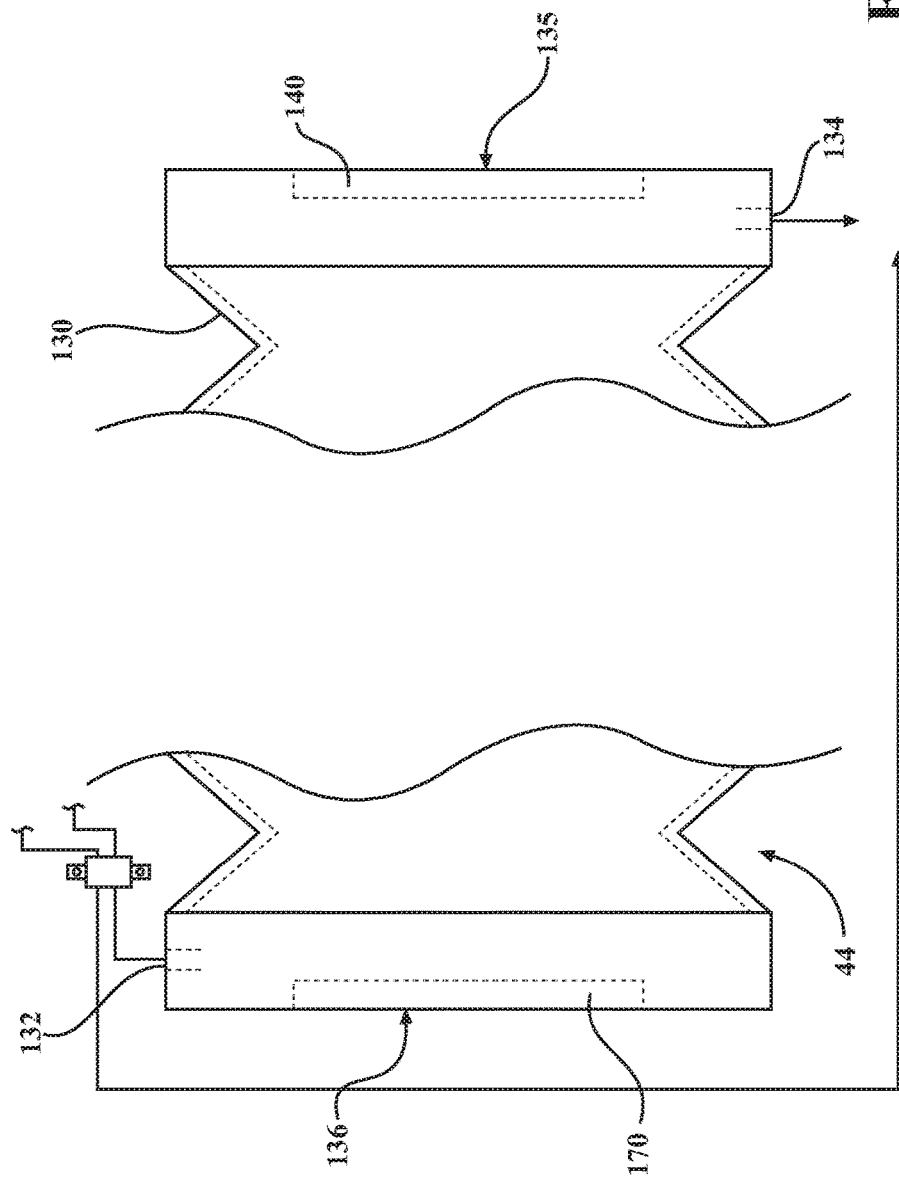
FIG. 6E illustrates a processing barrel, according to one or more aspects described herein.

As depicted in FIG. 6E, in some aspects, the outer wall may be a flexible wall that may be adjustable in length. The outer wall may be extended to increase the length of the exposure gap in folded or compressed to shorten the length of the exposure gap. As shown in FIG. 6E, the processing chamber 44 includes an outer processing vessel 130 that includes a flexible and compressible wall. The linear substrate inlet 135 is positioned at a first end of the outer processing vessel 130, and the linear substrate outlet 136 is positioned at the second end of the outer processing vessel 130, opposite the first end. The infusion fluid inlet 132 traverses the outer wall near the second end of the outer processing vessel 130 near the linear substrate outlet 136. The infusion fluid outlet 134 traverses the outer wall near the first end of the outer processing vessel 130, near the linear substrate inlet 135. In the aspect depicted in FIG. 6E, and infeed seal 140 is positioned at the linear substrate inlet 135, while it discharge seal 170 is positioned at the linear substrate outlet 136. The exposure gap is defined between the linear substrate inlet 135 and the linear substrate outlet 136, and the length of the exposure gap may be selected by extending or compressing the outer wall to achieve the desired exposure gap length.

While the outer wall is depicted in FIG. 6E as being nearly entirely flexible and compressible, it is contemplated that in some aspects, only a portion of the outer walls flexible and/or compressible. For example a center portion (or other portion) along the length of the outer wall may be flexible while other portions along the length of the outer wall are rigid. Moreover it is contemplated that the outer wall may be formed from a flexible material, such as a plastic or rubber, such that it can be expanded and/or contracted with or without being folded.

The infeed seal 140, the inner seal 150, and the discharge seal 170 retain the infusion fluid within the infusion chamber 102 and prevent flow from the ends of the outer processing vessel 130 or flow into the inner processing vessel 120. Specifically, the infeed seal 140 between the outer processing vessel 130 and the linear substrate and the discharge seal 170 between the inner processing vessel 120 and the outer processing vessel 130 prevent leaks of the infusion fluid from the ends of the outer processing vessel 130. Similarly, the inner seal 150 between the linear substrate and the inner processing vessel 120 prevents intrusion of the infusion fluid from the infusion chamber 102 into the inner processing vessel 120.

In some aspects, the outer processing vessel 130 includes the infusion fluid inlet 132 and the infusion fluid outlet 134. The infusion fluid inlet 132 and the infusion fluid outlet 134 are positioned proximal opposite ends of the outer processing vessel 130 and traverse the outer wall of the outer processing vessel. In some aspects, the infusion fluid inlet 132 and the infusion fluid outlet 134 are sized and shaped for connection with flexible or rigid piping to feed and drain the infusion fluid. In operation, the infusion fluid is fed into the infusion fluid inlet 132 and is exhausted from the processing barrel 44 through the infusion fluid outlet 134.

The inner processing vessel 120 is moveable substantially longitudinally into and out of the outer processing vessel 130. The inner processing vessel 120 extends from the outer processing vessel 130 at the end proximal the infusion fluid inlet 132.

In some aspects, the inner processing vessel 120 includes a length adjustment assembly interlock block 122 to interface with the length adjustment assembly 110. The length adjustment assembly interlock block 122 is positioned proximal a first end of the inner processing vessel 120. The length adjustment assembly interlock block 122 includes a recess configured to mate with a complementary pin 112 on the length adjustment assembly 110.

In some aspects, the adjustable length infusion cell 100 includes a track 124 to guide the length adjustment assembly interlock block 122 and the inner processing vessel 120. The length adjustment assembly interlock block 122 includes guide pins 126 which slide along the track 124 during adjustment of the length of the processing barrel 44. As the inner processing vessel 120 is extend from or retracted within the outer processing vessel 130, the inner processing vessel 120 is held in alignment with the outer processing vessel 130 by the guide pins 126 pressing against the track 124.

In some aspects, the inner processing vessel 120 includes a centering sleeve 162 positioned at the end of the inner processing vessel 120 disposed within the outer processing vessel 130. The centering sleeve 162 is affixed to the end of the inner processing vessel 120 and serves to maintain the inner processing vessel 120 centered within the inner cavity of the outer processing vessel 130. In conjunction with the guide pins 126 and the track 124, the centering sleeve 162 maintains alignment of the movable inner processing vessel 120 with the statically mounted outer processing vessel 130. If alignment were not maintained the inner processing vessel 120 could bind against the outer processing vessel 130 during extension and/or retraction of the adjustable length infusion cell 100.

Figure 7:
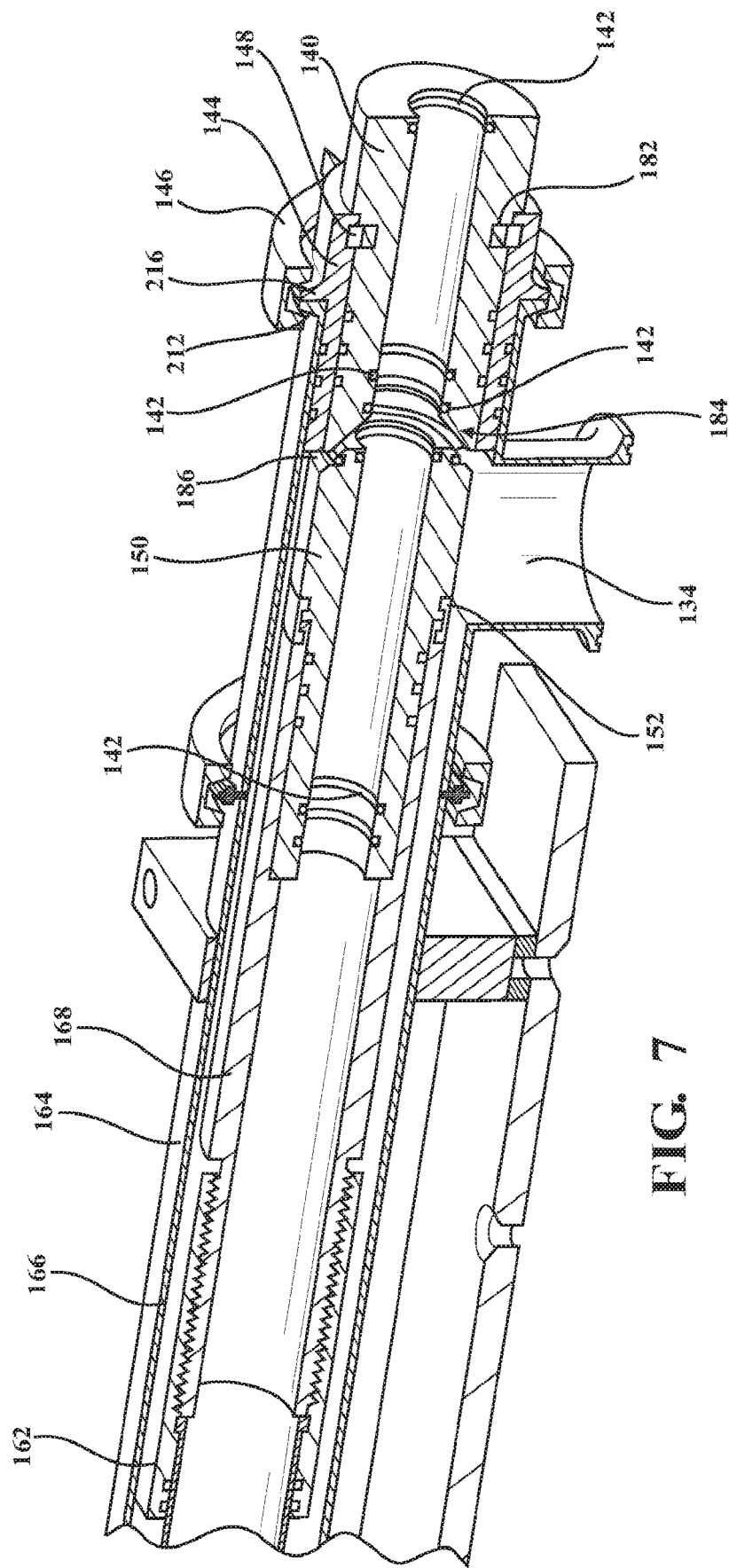
FIG. 7 illustrates an infeed seal and an inner wire seal assembled in a processing vessel, according to one or more aspects described herein.

With reference to FIG. 7, the centering sleeve 162 has centering portions 164 with an outer diameter substantially matching an inner diameter of the outer processing vessel 130 and flow passage portions 166 with an outer diameter less than the inner diameter of the outer processing vessel 130. The centering portions 164 of the centering sleeve 162 with a diameter substantially matching the inner diameter of the outer processing vessel 130 maintain the centering sleeve 162 in the center of the outer processing vessel 130. The flow passage portions 166 of the centering sleeve 162 with a diameter less than the inner diameter of the outer processing vessel 130 provide flow channels for passage of the infusion fluid between the inner processing vessel 120 (centering sleeve 162) and the outer processing vessel 130.

In some aspects, an inner processing vessel extension 168 is affixed to an end of the centering sleeve 162. The centering sleeve 162 may be slid on from the distal end of the inner processing vessel 120 and abutted against a lip on the proximal end of the inner processing vessel 120 with a portion of the centering sleeve 166 extending beyond the proximal end of the inner processing vessel 120. O-rings or other seals provide a seal between the outer diameter of the inner processing vessel 120 and the inner diameter of the centering sleeve 162. The inner processing vessel extension 168 may have a threaded engagement with the extended portion of the centering sleeve 162. As the inner processing vessel extension 168 is threadably engaged with the centering sleeve 162, the centering sleeve 162 is pulled tightly against the lip at the end of the inner processing vessel 120.

Figures 8A, 8B:
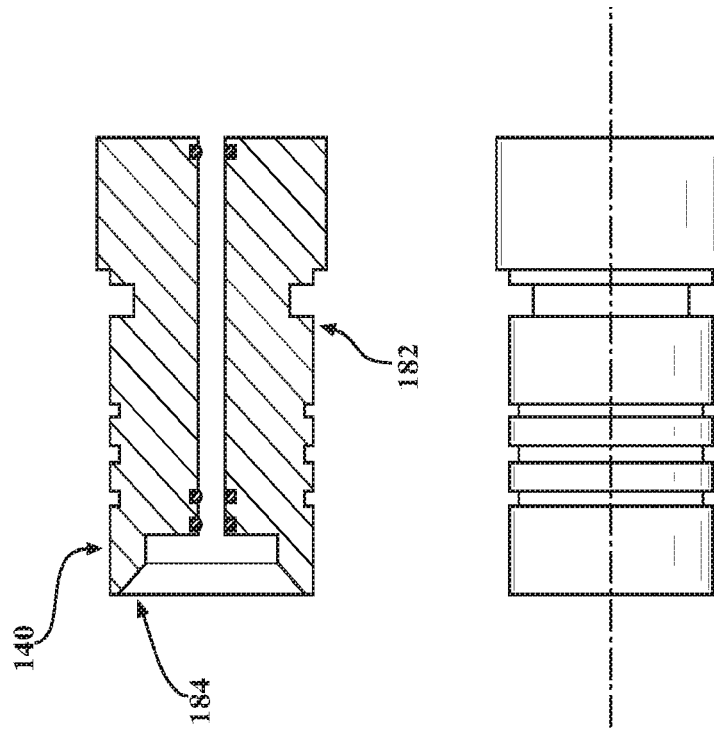
FIG. 8A illustrates an infeed seal, according to one or more aspects described herein.
FIG. 8B illustrates a cutaway view of FIG. 8A.

With reference to FIGS. 7, 8A, and 8B, an infeed seal 140 is provided on the end of the outer processing vessel 130 proximal the infusion fluid outlet 134. The infeed seal 140 seals the end of the outer processing vessel 130 while concurrently allowing the linear substrate to pass into the central cavity of the outer processing vessel 130. The infeed seal 140 includes a central bore sized to the linear substrate to be processed by the linear substrate infusion system 10.

In other words, the central bore is configured to allow the linear substrate to pass inot the processing barrel while substantially retaining the infusion fluid within the processin barrel. Disposed within the central bore are one or more o-rings 142 to provide a fluid tight seal between the infeed seal 140 and the linear substrate. In some aspects the infeed seal 140 has 3 o-rings 142 to provide redundant sealing capacity. In some aspects the o-rings 142 are positioned with a single o-ring 142 at the inlet to the infeed seal 140 and two o-rings 142 proximal the outlet or end of the infeed seal 140 toward the interior of the outer processing vessel 130.

In some aspects, an infeed seal release adaptor 144 is affixed to the end of the outer processing vessel 130. The end of the outer processing vessel 130 includes a radial flange 212 proximal the infeed seal release adaptor 144. The infeed seal release adaptor 144 includes a mating radial flange 216 to the radial flange 212 of the outer processing vessel 130. The infeed seal release adaptor 144 includes an outer diameter substantially matched to the inner diameter of the outer processing vessel 130. The infeed seal release adaptor 144 is slid into the end of the outer processing vessel 130 until the mating radial flanges 212, 216 of the infeed seal release adaptor 144 and the outer processing vessel 130 meet. An annular clamp 146, such as a sanitary clamp, is applied to the junction of the mating radial flanges 212, 216 of the infeed seal release adaptor 144 and the outer processing vessel 130 to secured the infeed seal release adaptor 144 and the outer processing vessel 130 together. In aspects, one or more o-rings 142 may be positioned between the outer diameter of the infeed seal release adaptor 144 and the inner diameter of the outer processing vessel 130 to provide a sealed connection. In some aspects, there are three o-rings 142 spaced along the length of the infeed seal release adaptor 144.

In some aspects, the infeed seal 140 includes a quick release connection to the infeed seal release adaptor 144. An annular groove 182 is provided on the exterior of the infeed seal 140 and a matching annular groove is provided on the interior of the infeed seal release adaptor 144. A disconnect ring 148 is sized to fit within the grooves in the infeed seal 140 and the infeed seal release adaptor 144. The disconnect ring 148 forms an incomplete circle such that the disconnect ring 148 may be compressed to form a circle of reduced diameter. When positioned in the expanded configuration, the disconnect ring 148 is disposed in the annular groove of the infeed seal release adaptor 144 and is partially disposed in the annular groove 182 of the infeed seal 140. Upon compression of the disconnect ring 148, the diameter is reduced such that the disconnect ring 148 is disposed fully in the annular groove 182 of the infeed seal 140 and entirely out of the annular groove of the infeed seal release adaptor 144. Thus, the infeed seal 140 may be slidably removed from the infeed seal release adaptor 144.

Figures 9A, 9B:
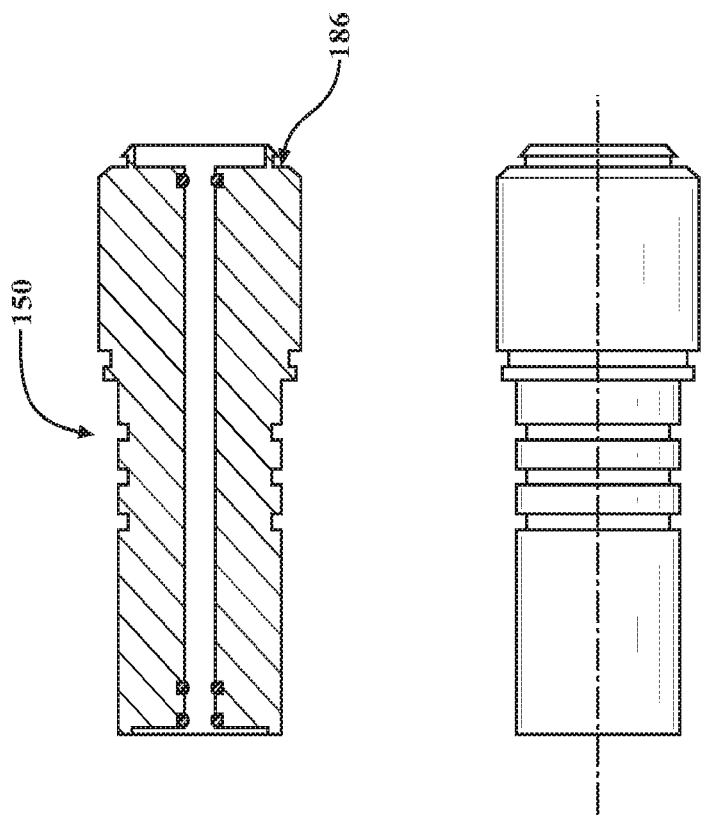
FIG. 9A illustrates an inner wire seal, according to one or more aspects described herein.
FIG. 9B illustrates a cutaway view of FIG. 9A.

With reference to FIGS. 7, 9A, and 9B, an inner seal 150 is provided on the end of the inner processing vessel extension 168. The inner seal 150 seals the end of the inner processing vessel 120 while concurrently allowing the linear substrate to pass out of the inner processing vessel extension 168 and the central cavity of the inner processing vessel 120. The inner seal 150 includes a central bore sized to the linear substrate to be processed by the linear substrate infusion system 10. In other words, the central bore is configured to allow the linear substrate to pass out of the processing barrel while substantially retaining the infusion fluid within the processing barrel. Disposed within the central bore are one or more o-rings 142 to provide a fluid tight seal between the inner seal 150 and the linear substrate. In some aspects the inner seal 150 has 3 o-rings 142 to provide redundant sealing capacity. In some aspects the o-rings 142 are positioned with a single o-ring 142 at the inlet to the inner seal 150 and two o-rings 142 proximal the outlet or end of the inner seal 150 toward the interior of the inner processing vessel 120 and the inner processing vessel extension 168.

In some aspects, the inner seal 150 is slid into the inner diameter of the inner processing vessel extension 168. The inner seal 150 is configured for quick release from the inner processing vessel extension 168. An inner seal disconnect ring 152 allows the inner seal 150 to be quickly removed from the inner processing vessel extension 168.

In some aspects, the end of the infeed seal 140 internal to the outer processing vessel 130 includes an inwardly tapered surface 184. The end of the inner seal 150 external to the inner processing vessel 120 includes an outwardly tapered surface 186 substantially complementary to the inwardly tapered surface 184 of the infeed seal 140. A groove is positioned on the outwardly tapered surface 186 of the inner seal 150 for housing an o-ring 142. When the adjustable length infusion cell 100 is in the most retracted configuration the inwardly tapered surface 184 of the infeed seal 140 and the outwardly tapered surface 186 of the inner seal 150 meet and the o-ring 142 provides a seal between the infeed seal 140 and the inner seal 150. In this configuration the linear substrate may be passed through the adjustable length infusion cell 100 without being exposed to the infusion fluid.

Figure 10:
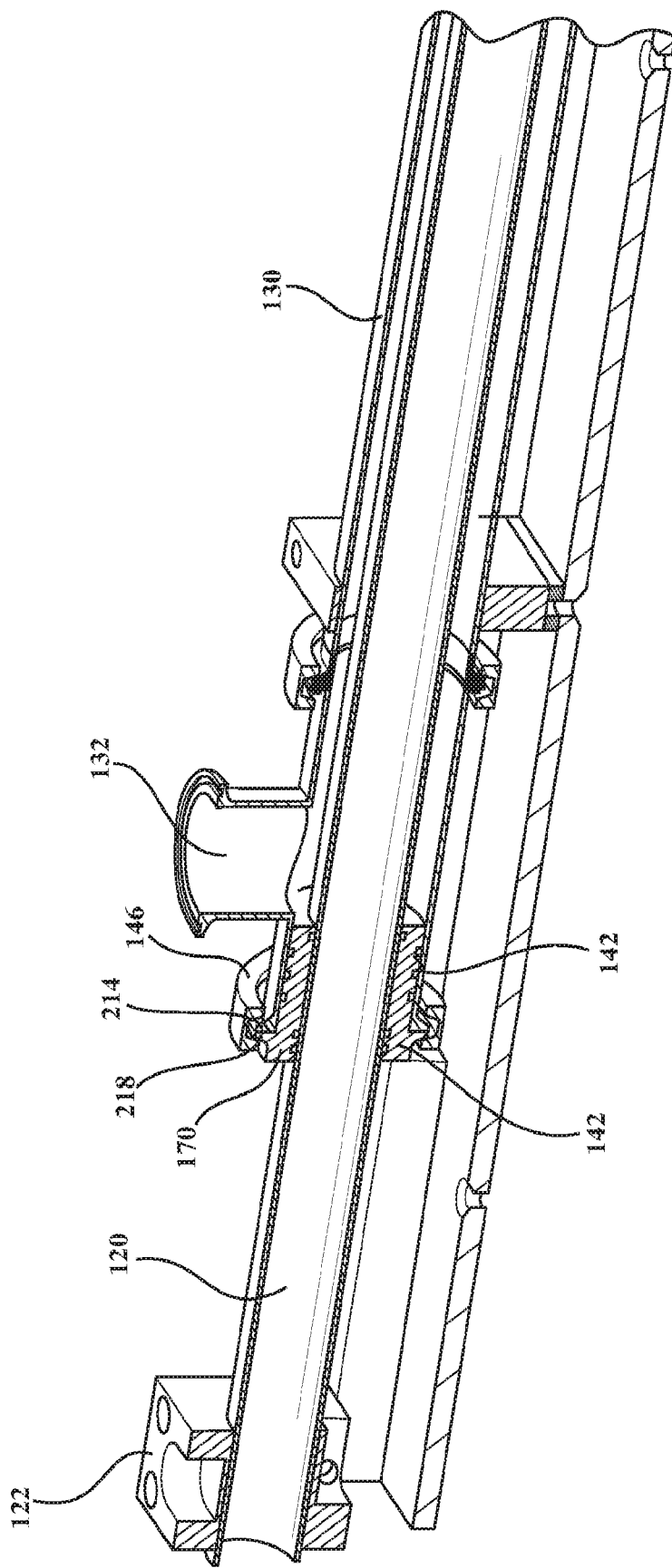
FIG. 10 illustrates a discharge seal as part of processing vessel, according to one or more aspects described herein.

With reference to FIG. 10, a discharge seal 170 is provided to form a substantially fluid tight connection between the outer processing vessel 130 and the inner processing vessel 120. The discharge seal 170 has an outer diameter substantially matching the inner diameter of the outer processing vessel 130. The discharge seal 170 is slid into the end of the outer processing vessel 130 proximal the infusion fluid inlet 132.

The discharge seal 170 includes a central bore sized to the outer diameter of the inner processing vessel 120. In other words, the discharge seal 170 has a central bore that is configured to allow portions of the inner processing vessel 120 to slideably pass into and out of the outer processing vessel. Disposed within the central bore is one or more o-rings 142 to provide a fluid tight seal between the inner processing vessel 120 and the discharge seal 170. In some aspects the discharge seal 170 has 3 o-rings 142 to provide redundant sealing capacity. In some aspects the o-rings 142 are positioned with a single o-ring 142 at the inlet or end of the discharge seal 170 toward the interior of the outer processing vessel 130 and two o-rings 142 proximal the outlet or end of the discharge seal 170 toward the exterior of the outer processing vessel 130.

In some aspects, an end of the outer processing vessel 130 includes a radial flange 214 proximal the discharge seal 170. The discharge seal 170 includes a mating radial flange 218 to the radial flange 214 of the outer processing vessel 130. The discharge seal 170 is slid into the end of the outer processing vessel 130 until the mating radial flanges 214, 218 of the discharge seal 170 and the outer processing vessel 130 meet. An annular clamp 146, such as a sanitary clamp, is applied to the junction of the mating radial flanges 214, 218 of the discharge seal 170 and the outer processing vessel 130 to secure the discharge seal 170 and the outer processing vessel 130 together. In aspects, one or more o-rings 142 may be positioned between the outer diameter of the discharge seal 170 and the inner diameter of the outer processing vessel 130 to provide a sealed connection. In some aspects, there are three o-rings 142 spaced along the length of the discharge seal 170.

The linear substrate for processing may be changed in the adjustable length infusion cell 100 in a quick change over operation. The infeed seal 140 and the inner seal 150, as indicated supra, are removable from the infeed seal release adaptor 144 and the inner processing vessel extension 168 respectively. To change the configuration of the adjustable length infusion cell 100 for a new linear substrate, the infeed seal 140 and the inner seal 150 are replaced with an infeed seal 140 and an inner seal 150 with central bores of a diameter configured and matched to the diameter of the new linear substrate to be processed. The quick release nature of the infeed seal 140 and the inner seal 150 allows the replacement of the infeed seal 140 and the inner seal 150 to occur in an expeditious fashion. To make the swap of the infeed seal 140 and the inner seal 150, flow of the infusion fluid is terminated to the adjustable length infusion cell 100 and any remaining length of the original linear substrate is removed. The infeed seal 140 and the inner seal 150 are removed and the new linear substrate is fed through the replacement infeed seal 140. The linear substrate is further advanced and fed through the replacement inner seal 150. The replacement inner seal 150 is attached to the inner processing vessel extension 168 and the replacement infeed seal 140 is attached to the infeed seal release adaptor 144. The linear substrate is then further advanced though the inner processing vessel 120 for connection to post-processing systems. The flow of the infusion fluid may then be reinitiated and processing of the new linear substrate may proceed. It will be appreciated that the linear substrate may also be feed through the infeed seal 140 and the inner seal 150 prior to attachment to the infeed seal release adaptor 144 and the inner processing vessel extension 168 respectively.

Figure 11A:
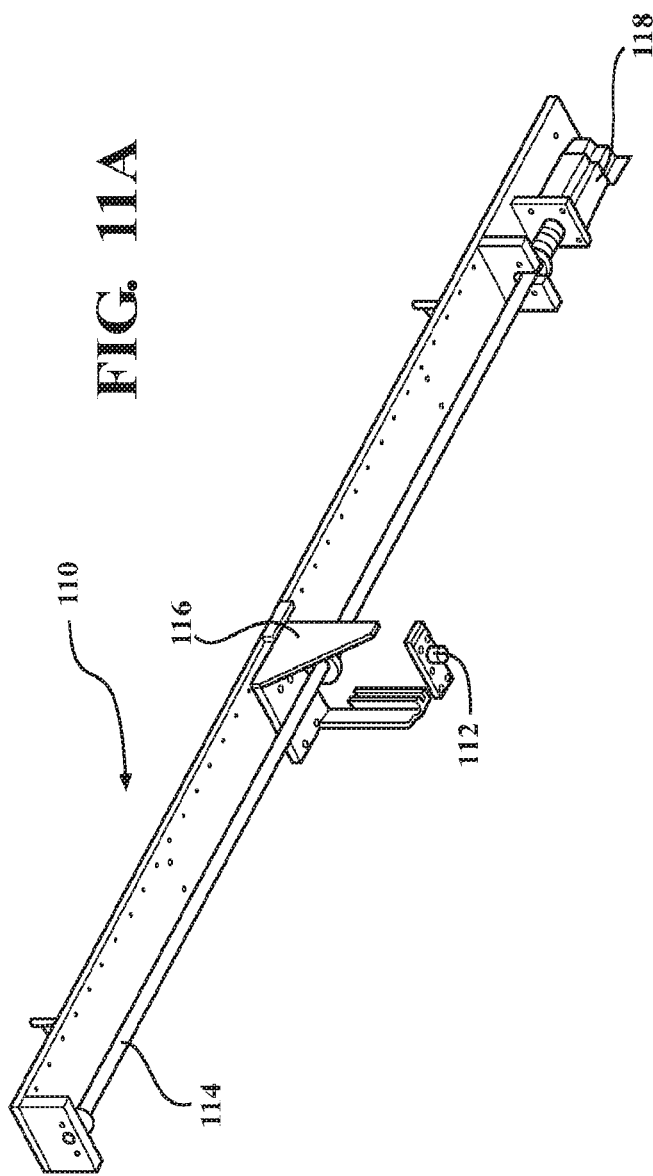
FIG. 11A illustrates a length adjustment assembly, according to one or more aspects described herein.
Figure 11B:
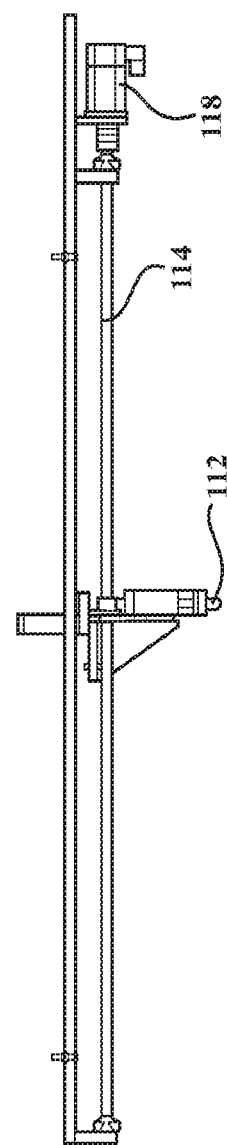
FIG. 11B illustrates a length adjustment assembly, according to one or more aspects described herein.
Figure 11C:
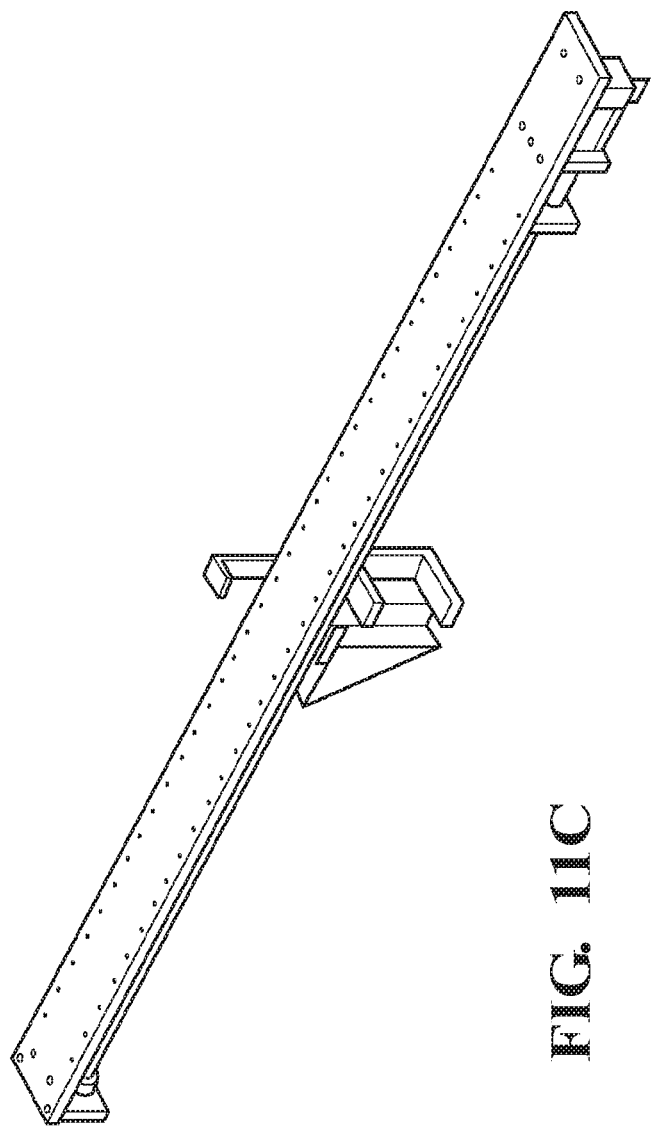
FIG. 11C illustrates a length adjustment assembly, according to one or more aspects described herein.

Referring to FIGS. 11A, 11B, and 11C, the length adjustment assembly 110 is configured to adjust the length of the processing barrel 44. The length adjustment assembly 110 includes the inner processing vessel engagement pin 112 mentioned above, an adjustment rod 114, a positioning trolley 116, and an adjustment motor 118. The inner processing vessel engagement pin 112 is configured to engage with the length adjustment assembly interlock block 122 attached to the inner processing vessel 120. The engagement between the inner processing vessel engagement pin 112 and the length adjustment assembly interlock block 122 results in the inner processing vessel 120 moving in tandem with movement of the inner processing vessel engagement pin 112 and positioning trolley 116. The inner processing vessel engagement pin 112 is connected to the positioning trolley 116 by a series of rollers. The connection between the inner processing vessel engagement pin 112 and the positioning trolley 116 allows the inner processing vessel engagement pin 112 to freely travel along a single axis perpendicular to the axis of travel of the positioning trolley 116.

In some aspects, the adjustment motor 118 rotates the adjustment rod 114 which causes the positioning trolley 116 to travel along the length of the adjustment rod 114. In some aspects, the adjustment motor is a servo motor. In some aspects, the adjustment rod 114 is threaded and the positioning trolley 116 is attached to the adjustment rod 114 with complementary threads such that rotation of the adjustment rod 114 results in travel of the positioning trolley 116 along the adjustment rod. The connection of the inner processing vessel engagement pin 112 to the positioning trolley 116 allows a controller to command the adjustment motor 118 to operate and adjust the length of the processing barrel 44 by moving the inner processing vessel 120 in or out of the outer processing vessel 130.

Movement of the inner processing vessel 120 in or out of the outer processing vessel 130 adjusts the exposure of the linear substrate to the infusion fluid by adjusting the length between the infeed seal 140 and the inner seal 150. As the inner processing vessel 120 is removed from the outer processing vessel 130, the gap between the infeed seal 140 and the inner seal 150 expands. The linear substrate is only exposed to the infusion fluid when traversing the distance between the infeed seal 140 and the inner seal 150. The infusion fluid enters the infusion fluid inlet 132, travels in the gap formed by the space between the outer diameter of the inner processing vessel 120 and the inner diameter of the outer processing vessel 130, through the flow passage portions 166 of the centering sleeve 162, and finally out the infusion fluid outlet 134.

Referring to FIGS. 3A, 3B, and 3C, the linear substrate infusion system 10 may include a plurality of valves to control the flow of the first colored dye solution from the first process tank 22, the second colored dye solution from the second process tank 32, and the flow of solvent from the clean solvent tank 56 to the infusion compartment 40 as well as away from the infusion compartment 40 to their respective reservoirs (the first process tank 22, the second process tank 32, and the solvent recovery tank 52). Specifically, a first colored dye inlet valve 60 controls flow of the first colored dye solution from the first process tank 22 to the infusion compartment 40 and a first colored dye outlet valve 62 controls flow of the first colored dye solution from the infusion compartment 40 back to the first process tank 22. Similarly, a second colored dye inlet valve 70 controls flow of the second colored dye solution from the second process tank 32 to the infusion compartment 40 and a second colored dye outlet valve 72 controls flow of the second colored dye solution from the infusion compartment 40 back to the second process tank 32. Finally, a solvent inlet valve 80 controls flow of the clean solvent from the clean solvent tank 56 to the infusion compartment 40 and a solvent outlet valve 82 controls flow of the spent solvent from the infusion compartment 40 to the solvent recovery tank 52. According to at least one aspect, one or more of the first colored dye inlet valve 60, the first colored dye outlet valve 62, the second colored dye inlet valve 70, the second colored dye outlet valve 72, the solvent inlet valve 80, and the solvent outlet valve 82 is a stainless steel ball valve, for example 316 stainless steel. Further, each of the first colored dye inlet valve 60, the first colored dye outlet valve 62, the second colored dye inlet valve 70, the second colored dye outlet valve 72, the solvent inlet valve 80, and the solvent outlet valve 82 may be manually or pneumatically actuated in various aspects.

In some aspects each dye supply 20, 30 is connected to each process tank 22, 32. For example, each dye supply 20, 30 may comprise one of 5 colors (red, yellow, blue, orange, and violet) which may be combined in varying ratios to create a multitude of colors in the process tanks 22, 32. A single array of dye supplies 20, 30 with each dye supply 20, 30 comprising a single color dye reduces manufacturing and supply costs by allowing the single array of dye supplies 20, 30 to charge and refresh each of the process tanks 22, 32 during operation.

In operation, the linear substrate infusion system 10 allows running changes to the color of dye infused into the linear substrate. FIG. 3A illustrates the linear substrate infusion system 10 and associated valves positioned for application of the first colored dye to the wire in the infusion compartment 40. Specifically, the first colored dye inlet valve 60 and the first colored dye outlet valve 62 are in an open position whereas the second colored dye inlet valve 70, the second colored dye outlet valve 72, the solvent inlet valve 80, and the solvent outlet valve 82 are in all a closed position. In the configuration for application of the first colored dye to the wire in the infusion compartment 40 the first colored dye is provided to the infusion compartment 40 and returned to the first process tank 22. Within the infusion compartment 40 the first colored dye is infused into the linear substrate.

During application of the first colored dye to the linear substrate, the heating loop for the second process tank 32 is activated to raise the temperature of the second colored dye to the desired temperature set point for infusion in the wire. The heating loop is activated in advance of the change from the first colored dye to the second colored dye to provide an opportunity to fully heat the second colored dye and negate the need to cease operation of the linear substrate infusion system 10 during the color conversion.

To initiate a change from the first colored dye to the second colored dye the infusion compartment 40 is flushed with solvent to remove residual of the first colored dye. FIG. 3B illustrates the linear substrate infusion system 10 and associated valves positioned for flushing the infusion compartment 40. Specifically, the first colored dye inlet valve 60 is closed while the first colored dye outlet valve 62 remains open. Concurrently, the solvent inlet valve 80 is opened to initiate flow of the solvent. The solvent acts to flush the infusion compartment 40 of the residual first colored dye. After a timed period, calculated to substantially flush all the residual first colored dye from the infusion compartment 40, the first colored dye outlet valve 62 is closed and the solvent outlet valve 82 is opened. This configuration provides a solvent loop to flush the infusion compartment 40 of any residual first colored dye. By adjusting the first colored dye outlet valve 62 and the solvent outlet valve 82 after the timed period substantially all the residual first colored dye is returned to the first process tank 22 and a minimal amount is flushed out with the solvent into the solvent recovery tank 52. It is desirable to minimize flow of colored dye into the solvent recovery tank 52 because the filter system 54 must remove any colored dye which is collected by the solvent. It will be appreciated that the time and/or volume of solvent required for the flush will vary based on the process implementation and volume of the infusion compartment 40 and associated piping and valves as well as the flow rate of the solvent.

FIG. 3C illustrates the linear substrate infusion system 10 and associated valves positioned for application of the second colored dye to the wire in the infusion compartment 40. Upon sufficient flushing of the infusion compartment 40 with the solvent, the solvent inlet valve 80 is closed while the solvent outlet valve 82 remains open. Concurrently, the second colored dye inlet valve 70 is opened to initiate flow of the second colored dye from the second process tank 32. The second colored dye acts to flush the infusion compartment 40 of the residual solvent and fully fill the infusion compartment 40 with the second colored dye. After a timed period, calculated to flush all the residual solvent from the infusion compartment 40, the solvent outlet valve 82 is closed and the second colored dye outlet valve 72 is opened. By adjusting the solvent outlet valve 82 and the second colored dye outlet valve 72 after the timed period, all the residual solvent is returned to the solvent recovery tank 52 with only a minimal amount flushed out with the solvent into the solvent recovery tank 52.

In further aspects, the second colored dye is utilized to flush the first colored dye and an intermediary solvent is omitted. To initiate a change from the first colored dye to the second colored dye, the first colored dye inlet valve 60 is closed while the first colored dye outlet valve 62 remains open. Concurrently, the second colored dye inlet valve 70 is opened to initiate flow of the second colored dye. The second colored dye acts to flush the infusion compartment 40 of the residual first colored dye. After a timed period, calculated to substantially flush all the residual first colored dye from the infusion compartment 40, the first colored dye outlet valve 62 is closed and a drain valve is opened to avoid cross contamination of the first colored dye into the second colored dye. Subsequently the drain valve is closed while the second colored dye outlet valve 72 is concurrently opened. By adjusting the first colored dye outlet valve 62, the drain valve, and the second colored dye outlet valve 72 after the timed period substantially all the residual first colored dye is returned to the first process tank 22 and a minimal amount of the first colored dye and the second colored dye is flushed out through the drain valve. In further aspects, the drain valve is omitted and the opening of the second colored dye outlet valve 72 and the first colored dye outlet valve 62 are timed to minimize transfer of the first colored dye and the second colored dye between the first colored dye process tank 22 and the second colored dye process tank 32.

Figure 12:
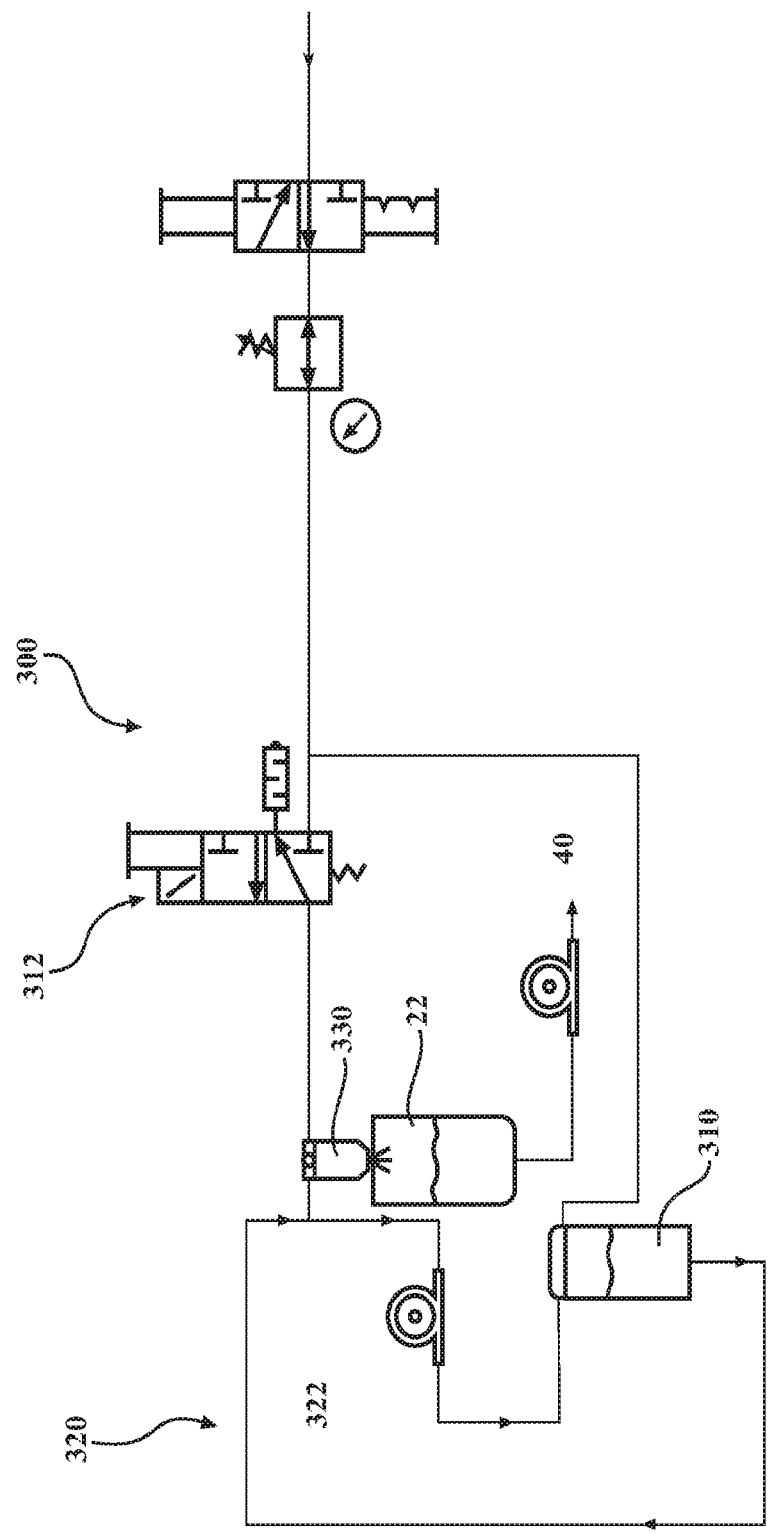
FIG. 12 illustrates a schematic of a fluid loop, according to one or more aspects described herein.

FIG. 12 illustrates additional aspects that are optionally included in the infusion system substantially as illustrated in FIGS. 3A-3C. the lines to and from a process tank 22 are optionally pressurized. Pressurizing some or all of the supply lines delivering concentrate to a process tank was found to improve delivery of additional dye to the process tank or intermixing of additive with the other components of an infusion fluid housed within the process tank. A pressurized system also allows for nearly instant injection of needed additive to the process tank upon demand. In some aspects, the supply lines are pressurized to a level in excess of 5 pounds per square inch (psi), optionally in excess of 10 psi, optionally in excess of 15 psi, optionally in excess of 20 psi, optionally in excess of 25 psi. In some aspects the lines are pressurized to 5 to 30 psi or any value or range therebetween. In other aspects, the supply lines are pressured to 5 psi or less.

As illustrated in FIG. 12, the process tank 22 is fluidically connected to an additive concentrate pot 310 that houses a concentrated solution, slurry, or other of additive (additive concentrate). Supply lines allow transfer of the additive concentrate to the color pot 22 in an on demand fashion. For example, should the system indicate that one additive (e.g. one dye in a multidye infusion fluid) has been depleted, a concentrate valve 312 may be opened to deliver additional additive concentrate in a desired amount to replenish the infusion fluid delivered to remainder of the system. The concentrate valve 312 is fluidically connected to a spray nozzle (or other delivery device) that injects or otherwise adds additional concentrate additive to the process tank upon demand of the concentrate valve 312. The concentrate pot 310 is optionally also fluidically connected to a pump 322 that may cycle the additive concentrate and return any excess concentrate not delivered to the process tank 22. It is appreciated that a single process tank 22 may be connected to one or a plurality of concentrate pots each housing one or more particular additive concentrates. For example, a single process tank may be fluidically connected to 1, 2, 3, 4, 5 or more concentrate pots fluidically connected to the process tank 22 by individual valving and optionally spray nozzles. In this way, should one or more of the additive concentrates (e.g. dye) be depleted from the infusion fluid at a higher rate than another, the infusion fluid may be individually adjusted by addition of only the additives that are depleted. Differential depletion rates of various additives can be accounted for to maintain constant additive levels in the infusion fluid being contacted with the linear substrate.

The adjustable length infusion cell 100 provides a capability to change the infusion fluid contacting the linear substrate with no or minimal scrap linear substrate generated. Changing the infusion fluid allows for color changes, addition or subtraction of an anti-weathering agent, addition of subtraction of a flame retardant, or the addition or subtraction of another additive. During an infusion fluid change, the inner processing vessel 120 is fully inserted into the outer processing vessel 130. When the inner processing vessel 120 is fully inserted into the outer processing vessel 130, the infeed seal 140 and the inner seal 150 abut and form a joint seal protecting the complete length of the linear substrate in the infusion chamber 102. The linear substrate is protected both from infusion and from heating (if desired) due to the temperature of the infusion fluid because the entire length of linear substrate is protected by the seals and the inner processing vessel 120. While advancement of the linear substrate is stopped in a protected configuration, the infusion fluid in the infusion chamber 102 may be changed.

Once the new infusion fluid is flowing to the adjustable length infusion cell 100 and at the desired temperature, the advancement of the linear substrate may be initiated. As the linear substrate begins speeding up the inner processing vessel 120 is retracted from the outer processing vessel 130 with the length adjustment assembly 110. The rate of retraction of the inner processing vessel 120 may be determined based on the acceleration of the linear substrate or by a controller based on real-time measurements of infusion (color measurements of linear substrate exiting the adjustable length infusion cell 100). Retracting the inner processing vessel 120 exposes an increased length of linear substrate to the infusion fluid, due to the increasing separation of the inner seal 150 from the infeed seal 140, to maintain a constant infusion time as the rate of travel of the linear substrate increases.

At the end of a linear substrate run for a given infusion fluid the inner processing vessel 120 is inserted back into the outer processing vessel 130 as the rate of travel of the linear substrate is decreased. Insertion continues until the inner processing vessel 120 is fully inserted into the outer processing vessel 130, the inner seal 150 abuts and forms a joint seal with the infeed seal 140, and the advancement of the linear substrate is stopped.

The linear substrate infusion system 10 can be provided with various controls. For example, an interface for operating the system can be provided. The interface may comprise a graphical user interface (GUI) to allow an operator to monitor and/or adjust process parameters. In various aspects the GUI pay provide one or more of a) colored dye temperature in the process tank 22, 32, b) colored dye temperature in infusion compartment 40, c) solvent flow rate, d) position of valves, e) linear substrate feed speed, f) control pump on/off, g) fluid level in process tanks 22, 32, h) fluid level in solvent recovery tank 52, i) fluid level in clean solvent tank 56, j) fluid level in process tanks 22, 32, k) fluid temperature in the solvent recovery tank 52, l) temperature setting of process tanks 22, 32 (thermocouple), m) linear substrate footage counter, and n) dye supply 20, 30 level indication.

One or more sensors may be included in the system. A sensor may be used to monitor various aspects of system operation illustratively pressure, linear substrate speed, temperature, among others.

In some aspects, during operation of the linear substrate infusion system 10, the infusion compartment 40 is maintained at approximately atmospheric pressure (1 atm). In further aspects, the pressure in the infusion compartment 40 is maintained below 3 atm. In yet further aspects the pressure in the infusion compartment is maintained between 0.1 atm and 3 atm, 0.5 atm and 2 atm, 0.8 atm and 1.5 atm, 0.8 atm and 1 atm, or any range of values therebetween. It has been determined that certain combinations of infusion fluid formulations and linear substrate materials are not substantially effected by the pressure in the infusion compartment 40. As such, it is envisioned that the pressure in the infusion compartment 40 need not be raised above 1 atm for effective infusion of the linear substrate.

The counterflow arrangement of the linear substrate infusion system 10 and more specifically the counterflow of the linear substrate and the infusion fluid in the infusion compartment 40 provides improved infusion characteristics. Without being limited to one particular theory, it is believed that the counterflow arrangement creates turbulence in the infusion fluid. Turbulence in the infusion fluid is believed to consistently expose the linear substrate to fresh infusion fluid with maximum concentration of additives. Additionally, the counterflow arrangement also exposes the linear substrate to infusion fluid with increasing concentration of additives during passage through the infusion compartment 40. Specifically, the linear substrate entering the infusion compartment 40 is in contact with the infusion fluid exiting the infusion compartment and the linear substrate just prior to exiting the infusion compartment 40 is exposed to fresh infusion fluid first entering the infusion compartment 40.

In some aspects, an infusion system includes devices suitable to monitor and/or control the infusion process. Such devices may be used to optically or otherwise monitor the resulting infused color parameters on whatever color scale is desired. The infusion of additive material into the linear substrate being processed may be impacted by the contact time between the linear substrate and the additive ("infusion time"), the infusion fluid temperature, and the dye concentration in the infusion fluid. A control system may adjust these parameters to obtain the desired final infusion levels or parameters. For example, as the infusion time affects the level of infusion, the infusion time may be adjusted by controlling the speed of the linear substrate through the infusion compartment 40. The composition of additive materials within the infusion fluid also affects the resultant depth, amount of additive penetration, or other.

In some aspects, the linear substrate infusion system 10 includes a color analysis camera. The color analysis camera records the color of the linear substrate exiting the infusion compartment 40. The color analysis camera may record the color of the linear substrate using any color scale, for example, RGB, CMYK, or L*a*b* (1976 CIE L*a*b* Space). As the linear substrate exits the infusion compartment 40, the color of the linear substrate is measured by the color analysis camera and compared to the desired color parameters. A controller analyzes the difference between the measured color value and the target color value and implements adjustments to the formulation of the infusion fluid to correct the resulting color of future processed linear substrate. For example, if the resulting color of the linear substrate lacks yellow the controller (automatic or manual) may instruct the dye supply 20, 30 to provide an additional bolus of yellow dye into the process tank 22, 32 to replenish the yellow dye supply and correct the color balance of the processes linear substrate.

The L*a*b* standard represents perceived color in a 3-dimensional space. The central vertical axis represents lightness (signified as L*) whose values run from 0 (black) to 100 (white). The color axes are based on the fact that a color can't be both red and green, or both blue and yellow, because these colors oppose each other. On each axis the values run from positive to negative. On the a* axis, positive values indicate amounts of red while negative values indicate amounts of green. On the b* axis, yellow is positive and blue is negative. For both axes, zero is neutral gray.

Determination of how the final color of the linear substrate is affected by each of the colored dyes may be achieved through a series of experimental runs with each colored dye adjusted and the resulting color change recorded. It was determined that yellow depletion outpaces red depletion which outpaces blue depletion when infusing an amide polymer. This was determined by coloring a series of linear substrate and not replenishing the dyes during the processing runs. The resulting color balance of the last portion of linear substrate compared to the first potion or linear substrate illustrates the shift in resulting color from depletion of dyes during linear substrate processing. Table 1, provided infra, provides the initial and final L*a*b* values as well as the resulting ΔE from the color change. The color balance for the experimental runs were 50% of the blue component, 42% of the red component, and 8% of the yellow component to achieve a target grey color. It is noted that the data was obtained from runs of cable originating from different spools with each spool of cable having different background L values. As the dyes are transparent, the difference in background L value for each spool of cable results in an effect on the initial L value, final L value, and the ΔE. To account for the difference in the L values of the stock cable, in some aspects, the L component is eliminated in color analysis from color analysis camera and only the a* and b* components are adjusted to achieve color match and/or correction.

| Feet Processed | L value prior | L value after | A value prior | A value after | B value prior | B value after | ΔE |
|---|---|---|---|---|---|---|---|
| 1560 | 93.8 | 91.6 | −19.3 | −18.6 | 17 | 16.1 | 2.48 |
| 2300 | 92.9 | 92.3 | −19.1 | −18.9 | 14.4 | 13.9 | 0.81 |
| 816 | 93.1 | 89.4 | −19.7 | −19.6 | 15.9 | 15.4 | 3.74 |
| 1880 | 90.6 | 90.8 | −19.1 | −18.9 | 14.6 | 13.9 | 0.76 |

In one experimental series, test cable with a target L*a*b color parameter of L*=93.7, a*=−20.7, and b*=15.6 was processed. To determine how the addition of yellow dye to the infusion fluid affects the ultimate color of the processed cable the infusion fluid was initially started with a known incorrect color balance. A series of 10 boluses of 1 gram (g) of yellow dye was added to the infusion fluid and the resulting L*a*b* color values of the resulting processed cable was recorded. Table 2, provided infra, provides the resulting L*a*b* color values after each addition of a yellow dye bolus.

| Yellow added (g) | A value before | B value before | A value after | B value after | Run length |
|---|---|---|---|---|---|
| 1y | −19.3 | 10.3 | −19.3 | 10.8 | 0 feet |
| 1y | −19.3 | 10.8 | −19.4 | 11.3 | — |
| 1y | −19.4 | 11.3 | −19.5 | 11.6 | — |
| 1y | −19.5 | 11.6 | −19.6 | 12.1 | — |
| 1y | −19.6 | 12.1 | −19.8 | 12.6 | — |
| 1y | −19.8 | 12.6 | −19.9 | 13.1 | — |
| 1y | −19.9 | 13.1 | −20.1 | 13.6 | — |
| 1y | −20.1 | 13.6 | −20.2 | 14.1 | — |
| 1y | −20.2 | 14.1 | −20.2 | 14.4 | — |
| 1y | −20.2 | 14.4 | −20.3 | 15.1 | 1200 feet |

The process of coloring a linear substrate, such as a polymer or amide coated conductive cable or wire, in a post-production process will now be described in relation to FIG. 1 and the schematics of FIGS. 3A-3C. The linear substrate can be supplied on a payoff reel and advanced into the linear substrate infusion system 10. The linear substrate may also be provided as a direct output of the linear substrate manufacturing process optionally as downstream from an extruder. Introduction of the linear substrate into the linear substrate infusion system 10 can be set at a predetermined speed, which depends on the desired residence time for the linear substrate to be in contact with the colored dye. In one example, the speed of the linear substrate can be set at 50 ft/min to 400 ft/min.

The linear substrate is passed through the infusion compartment 40 containing the colored dye to infuse the colored dye into the linear substrate. The linear substrate is maintained in the infusion compartment 40 for a predetermined infusion time to ensure that the colored dye is properly infused into the linear substrate. In one example, the infusion time can range from a fraction of a second to many seconds. For example, the infusion time may be between 2 and 6 seconds.

As shown in 3A-3C, the first process tank 22 and the second process tank 32 are heated to raise the temperature of the first colored dye and second colored dye respectively. In one example, the infusion fluid is heated to a temperature of 80° C. to 99.9° C. In another example, the infusion fluid can be heated to 90° C. −99.9° C. The infusion fluid is heated as close as possible to the boiling temperature of water at 100° C. (at 1 atm). In one specific example, the infusion fluid is heated to approximately 99° C. The colored dye is dissolved in the infusion fluid. Further, heating the infusion fluid increases the solubility of the dye within the infusion fluid and thereby increases the ability for the dye particles to be infused into the linear substrate jacket from the infusion fluid.

The first dye pump 24 and second dye pump 34 respectively pump the first colored dye from the first process tank 22 and the second colored dye from the second process tank 32 to the infusion compartment 40 and back to the first process tank 22 or second process tank 32. The passage of the first colored dye or the second colored dye through the infusion compartment 40 contacts the colored dyes with the linear substrate and results in the dyeing of the linear substrate. It is also contemplated that the first process tank 22 and the second process tank 32 are connected to the first dye supply 20 and the second dye supply 30 respectively, which are configured to add additional colored dye as needed to the first and second process tanks 22, 32. However, other methods of colored dye addition are also contemplated. Additional colored dye is added to the first and second process tanks 22, 32 from the first dye supply 20 and the second dye supply 30 to account for dye depletion during coloring operations. As linear substrate is processed the colored dyes in the infusion fluid are transferred from the infusion fluid and into the linear substrate. Thus, there is a resulting drop in the concentration of colored dyes (and other additives) in the infusion fluid. Colored dyes are replenished into the infusion fluid in the processing tanks 22, 32 to account for the transfer of colored dyes from the infusion fluid to the linear substrate.

Upon exiting the infusion compartment 40, the linear substrate can then be transferred to one or more rinsing stations 190 where water or other rinse agent is contacted to the infused linear substrate to remove any excess additive. In some aspects, a linear substrate is transferred to one or more air wipes 90, where air is blown onto the linear substrate to remove any excess colored dye and to generally cool and dry the linear substrate. It is appreciated that the process and system do not require an air wipe which in some aspects is specifically excluded.

An infused linear substrate produced in accordance with this disclosure may include one or more structural layers, optionally with only the outer layer or portion thereof infused with an additive. The outer layer may include an infused layer extending only partially through the thickness of the outer layer or may be fully infused through the entirety of the outer layer depending on the outer layer thickness and in accordance with aspects of this disclosure.

In some aspects, the use of infused dye as an exemplary additive as provided herein can impart color with sufficient transparency to allow for marking present on the linear substrate prior to the infusion process to be viewed through the infused dye thereby not obscuring the markings. In some aspects, marking or additional marking is imparted onto the linear substrate following the infusion process to add information, decoration, or other. Optionally, laser marking is used to substantially bleach the infused colorant where the laser contacts the substrate forming clean, well identified marking which is possible due only to the color being infused into the surface of the linear substrate. As such, a process and apparatus optionally include elements for inscribing marking onto the surface of an infused linear substrate.

The type of laser used will depend on the additive used to impart color or other physical or chemical characteristic to the linear substrate. For example, a laser may be matched to the additive infused into the linear substrate such that the wavelength of the laser will react with the additive to change an optical characteristic of the additive thereby creating a marking on the linear substrate. Examples of useful lasers are a $CO_2$ laser or a or a Nd:YAG laser (Neodymium: Yttrium Aluminum Garnet, the garnet crystal being composed of the elements yttrium, aluminum and oxygen). Such lasers are commercially available.

Marking by a laser may be imparted into an infused linear substrate by irradiating the substrate at an appropriate wavelength for a time sufficient to impart marking to the surface of the linear substrate and in the desired configuration. Wavelengths may be in in the UV, visible, or infrared region of the spectrum.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

The present invention is disclosed above and in the accompanying drawings with reference to a variety of examples. The purpose served by the disclosure, however, is to provide examples of the various features and concepts related to the invention, not to limit the scope of the invention. One skilled in the relevant art will recognize that numerous variations and modifications may be made to the examples described above without departing from the scope of the present invention.

While particular aspects have been illustrated and described herein, it should be understood that various other changes and modifications may be made without departing from the spirit and scope of the described subject matter. Moreover, although various aspects have been described herein, such aspects need not be utilized in combination.

It is to be understood that the presently disclosed inventive concepts are not limited in application to the details of construction and/or the arrangement of the components set forth in the previous description or illustrated in the drawings. The presently disclosed inventive concepts are capable of other aspects, or of being practiced or carried out in various ways. Also, it is to be understood that the phraseology and terminology employed herein is for purpose of description and should not be regarded as limiting.

Patents and publications mentioned in the specification are indicative of the levels of those skilled in the art to which the invention pertains. These patents and publications are incorporated herein by reference to the same extent as if each individual application or publication was specifically and individually incorporated herein by reference.

What is claimed is:

1. A method for modifying an aspect of a linear substrate, the method comprising:
   providing a processing barrel comprising an outer wall having opposing ends, the processing barrel further comprising a modifying fluid comprising additives;
   traversing the linear substrate through the processing barrel at a given speed to infuse the additives to the linear substrate, the linear substrate being in a fluid communication with the modifying fluid, wherein traversing the linear substrate through the processing barrel further comprises increasing or decreasing the given speed;
   defining an exposure length of the linear substrate as a length of the linear substrate that is in the fluid communication with the modifying fluid in the processing barrel; and
   configuring the exposure length to greater than zero during an acceleration of the linear substrate from the given speed due to the increase or the decrease of the given speed, wherein configuring the exposure length during the acceleration further comprises:
      increasing the exposure length with an increase in the acceleration of the of the linear substrate from the given speed; and
      decreasing the exposure length with a decrease in the acceleration of the of the linear substrate from the given speed.

2. The method of claim 1, wherein configuring the exposure length comprises moving one of a linear substrate inlet and a linear substrate outlet to a first relative position of a plurality of relative positions, wherein in the first relative position, one of the linear substrate inlet and the linear substrate outlet is located between the opposing ends of a wall and the exposure length having a first length that is greater than zero.

3. The method of claim 2, wherein configuring the exposure length comprises moving one of the linear substrate inlet and the linear substrate outlet to a second relative position of the plurality of relative positions, wherein in the second relative position, one of the linear substrate inlet and linear substrate outlet is in a second relative position that is different from the first relative position, and wherein in the second relative position the exposure length has a second length that is different from the first length.

4. The method of claim 2, wherein configuring the exposure length comprises moving one of the linear substrate inlet and the linear substrate outlet to a second relative position of the plurality of relative positions, wherein in the second relative position the exposure length that is less than 50% of the first length.

5. The method of claim 1, wherein an exposure of an exterior polymer material of the linear substrate varies with a speed of the linear substrate.

6. The method of claim 1, wherein the processing barrel further comprises a linear substrate inlet and a linear substrate outlet, and wherein the linear substrate inlet and the linear substrate outlet comprise seals.

7. The method of claim 1, the processing barrel further including a fluid inlet and a fluid outlet, and wherein the fluid inlet is positioned toward one end of the processing barrel and the fluid outlet is positioned toward the other end of the processing barrel.

8. The method of claim 1, wherein the processing barrel further comprises an inner processing vessel and an outer processing vessel, the inner processing vessel and the outer processing vessel forming a nested arrangement along a longitudinal length of the processing barrel, the inner processing vessel being axially moveable relative the outer processing vessel.

9. The method of claim 8, wherein the processing barrel further comprises a linear substrate inlet and a linear substrate outlet, and wherein the linear substrate inlet includes an infeed seal having a central bore configured to allow the linear substrate to pass into the processing barrel while substantially retaining fluid within the processing barrel.

10. A method for modifying an aspect of a linear substrate, the method comprising:
providing a processing barrel comprising an outer processing vessel and an inner processing vessel, the inner processing vessel and the outer processing vessel forming a nested arrangement along a longitudinal length of the processing barrel with at least a portion of a chamber defined therebetween, the processing barrel further comprising a linear substrate inlet and a linear substrate outlet;
defining an exposure gap between the linear substrate inlet and the linear substrate outlet;
traversing a linear substrate across the exposure gap at a given speed to infuse additives from a modifying fluid contained in the exposure gap to the linear substrate, wherein traversing the linear substrate further comprises increasing or decreasing the given speed; and
configuring a length of the exposure gap to greater than zero during an acceleration of the linear substrate from the given speed due to the increase or the decrease of the feed speed, wherein configuring the length of the exposure gap during the acceleration further comprises:
increasing the length of the exposure gap with an increase in the acceleration of the of the linear substrate from the given speed; and
decreasing the length of the exposure gap with a decrease in the acceleration of the of the linear substrate from the given speed.

11. The method of claim 10, wherein the processing barrel further comprises a liquid inlet and a liquid outlet in liquid communication with the chamber.

12. The method of claim 10, wherein the linear substrate inlet comprises an inlet seal, and wherein the linear substrate inlet comprises an outlet seal.

13. The method of claim 10, wherein the length of the exposure gap comprises a first length that is greater than zero.

14. The method of claim 13, wherein the length of the exposure gap comprises a second length that is less than the first length.

15. The method of claim 10, wherein the linear substrate inlet comprises an inlet seal that has an inner diameter configured to allow a linear substrate to pass into the processing barrel while substantially retaining infusion liquid within the processing barrel.

16. A method for modifying an aspect of a linear substrate, the method comprising:
providing a processing barrel comprising an outer processing vessel and an inner processing vessel the inner processing vessel and the outer processing vessel forming a nested arrangement along a longitudinal length of the processing barrel with at least a portion of a chamber defined therebetween, the processing barrel also having a linear substrate inlet and defining an inlet opening into the chamber and a linear substrate outlet and defining an outlet out of the chamber,
defining an exposure gap between the linear substrate inlet and the linear substrate outlet;
traversing a linear substrate across the exposure gap at a given speed to infuse additives from a modifying fluid contained in the exposure gap to the linear substrate, wherein traversing the linear substrate further comprises increasing or decreasing the given speed; and
configuring a length of the exposure gap to greater than zero during an acceleration of the linear substrate from the given speed due to the increase or the decrease of the given speed, wherein configuring the length of the exposure gap during the acceleration further comprises:
increasing the length of the exposure gap with an increase in the acceleration of the of the linear substrate from the given speed; and
decreasing the length of the exposure gap with a decrease in the acceleration of the of the linear substrate from the given speed.

17. The method of claim 16, wherein configuring the length of the exposure gap comprises moving one of the linear substrate inlet and the linear substrate outlet to a first relative position and to a second relative position of a plurality of relative positions, wherein in the second relative position that is different from the first relative position.

18. The method of claim 17, wherein in the second relative position, the exposure gap having a second length that is less than the first length.

19. The method of claim 17, wherein the processing barrel further comprises portions defining a liquid inlet and a liquid outlet in liquid communication with the chamber.

20. The method of claim 16, wherein an aspect of an exterior polymer material of the linear substrate is modified.

* * * * *